US012074702B2

(12) United States Patent
Hong et al.

(10) Patent No.: US 12,074,702 B2
(45) Date of Patent: Aug. 27, 2024

(54) METHODS AND PROCEDURES FOR FLEXIBLE AND HIGHLY-PARALLEL POLAR ENCODING AND DECODING

(71) Applicant: INTERDIGITAL PATENT HOLDINGS, INC., Wilmington, DE (US)

(72) Inventors: Sungkwon Hong, Seoul (KR); Onur Sahin, London (GB)

(73) Assignee: INTERDIGITAL PATENT HOLDINGS, INC., Wilmington, DE (US)

(*) Notice: Subject to any disclaimer, the term of this patent is extended or adjusted under 35 U.S.C. 154(b) by 444 days.

(21) Appl. No.: 17/425,441

(22) PCT Filed: Jan. 29, 2020

(86) PCT No.: PCT/US2020/015707
§ 371 (c)(1),
(2) Date: Jul. 23, 2021

(87) PCT Pub. No.: WO2020/160167
PCT Pub. Date: Aug. 6, 2020

(65) Prior Publication Data
US 2022/0094468 A1    Mar. 24, 2022

Related U.S. Application Data

(60) Provisional application No. 62/798,121, filed on Jan. 29, 2019.

(51) Int. Cl.
*H04L 1/00* (2006.01)
*H04W 88/08* (2009.01)

(52) U.S. Cl.
CPC .......... *H04L 1/0041* (2013.01); *H04L 1/0045* (2013.01); *H04L 1/0057* (2013.01); *H04W 88/08* (2013.01)

(58) Field of Classification Search
CPC ... H04L 1/0041; H04L 1/0045; H04L 1/0057; H04W 88/08
See application file for complete search history.

(56) References Cited

U.S. PATENT DOCUMENTS

2018/0026663 A1* 1/2018 Wu ..................... H03M 13/618
714/776

FOREIGN PATENT DOCUMENTS

WO    2018034872 A1    2/2018

OTHER PUBLICATIONS

Arikan, "Channel Polarization: A Method for Constructing Capacity-Achieving Codes for Symmetric Binary-Input Memoryless Channels," IEEE Transactions on Information Theory, vol. 55, No. 7, pp. 3051-3073 (Jul. 2009).

(Continued)

*Primary Examiner* — Erika A Washington
(74) *Attorney, Agent, or Firm* — Volpe Koenig

(57) ABSTRACT

A method performed by a WTRU may comprise generating a polar factor graph and pruning the polar factor graph to generate a pruned factor graph. The pruned factor graph may include input variable nodes, check nodes and output variable nodes. The method may further comprise the initializing input variable nodes. For each of a plurality of encoding levels of the pruned factor graph, values from the input variable nodes may be transferred to the check nodes. Operations, for example, XOR) additions, may be performed on the values of the check nodes. Check nodes having a single connection to another node not used in a previous transfer may be identified. Values from the identified check nodes may be transferred to the input variable nodes. Binary values from the input variable nodes may be transferred to the output variable nodes for transmission to a receiver.

20 Claims, 16 Drawing Sheets

(56) References Cited

OTHER PUBLICATIONS

Arikan, "Polar codes: A pipelined implementation," 4th International Symposium on Broadband Communication (ISBC 2010), Melaka, Malaysia (Jul. 11-14, 2010).
Cammerer et al., "Sparse Graphs for Belief Propagation Decoding of Polar Codes," 2018 IEEE International Symposium on Information Theory (ISIT), Vail, CO, USA, pp. 1465-1469 (2018).
Fossorier, "Polar Codes: Graph Representation and Duality," IEEE Communications Letters, vol. 19, No. 9 (Sep. 2015).
IEEE Standard for Information Technology—Telecommunications and information exchange between systems—Local and metropolitan area networks—Specific requirements; Part 11: Wireless LAN Medium Access Control (MAC) and Physical Layer (PHY) specifications; Amendment 5: Television White Spaces (TVWS) Operation, IEEE 802.11af-2013 (Dec. 11, 2013).
IEEE Standard for Information technology—Telecommunications and information exchange between systems—Local and metropolitan area networks—Specific requirements; Part 11: Wireless LAN Medium Access Control (MAC) and Physical Layer (PHY) Specifications; Amendment 5: Enhancements for Higher Throughput, IEEE Std 802.11n-2009 (Sep. 2009).
IEEE Standard for Information technology—Telecommunications and information exchange between systems Local and metropolitan area networks—Specific requirements; Part 11: Wireless LAN Medium Access Control (MAC) and Physical Layer (PHY) Specifications; Amendment 2: Sub 1 GHz License Exempt Operation, IEEE 802.11ah-2016 (Dec. 7, 2016).
IEEE Standard for Information technology—Telecommunications and information exchange between systems—Local and metropolitan area networks—Specific requirements; Part 11: Wireless LAN Medium Access Control (MAC) and Physical Layer (PHY) Specifications, IEEE Std. 802.11-2016 (Dec. 7, 2016).
IEEE Standard for Information technology—Telecommunications and information exchange between systems—Local and metropolitan area networks—Specific requirements; Part 11: Wireless LAN Medium Access Control (MAC) and Physical Layer (PHY) Specifications; Amendment 4: Enhancements for Very High Throughput for Operation in Bands below 6GHZ, IEEE Std 802.11ac-2013 (Dec. 11, 2013).
Koike-Akino et al., "Turbo Product Codes with Irregular Polar Coding for High-Throughput Parallel Decoding in Wireless OFDM Transmission," 2018 IEEE International Conference on Communications (ICC), pp. 1-7 (2008).
Kschischang et al., "Factor graphs and the sum-product algorithm," IEEE Transactions on Information Theory, vol. 47, No. 2, pp. 498-519 (Feb. 2001).
Niu et al., "CRC-Aided Decoding of Polar Codes," IEEE Communications Letters, vol. 16, No. 10, pp. 1668-1671, Oct. 2012.
Pyndiah et al., "Near-optimum decoding of product codes: block turbo codes," IEEE Transactions on Communications, vol. 46, No. 8, pp. 1003-1010 (Aug. 1998).
Tal et al., "How to Construct Polar Codes," IEEE Transactions on Information Theory, vol. 59, No. 10 (Oct. 2013).
Tal et al., "List Decoding of Polar Codes," arXiv:1206.0050v1 [cs.IT] (May 31, 2012).
Vangala et al., "A Comparative Study of Polar Code Constructions for the AWGN Channel," arXiv:1501.02473v1 [cs.IT] (Jan. 11, 2015).
Third Generation Partnership Project, "Technical Specification Group Radio Access Network; NR; Multiplexing and channel coding (Release 15)," 3GPP TS 38.212 V15.0.0 (Dec. 2017).
Third Generation Partnership Project, "Technical Specification Group Radio Access Network; NR; Multiplexing and channel coding (Release 15)," 3GPP TS 38.212 V15.4.0 (Dec. 2018).
Third Generation Partnership Project, "Technical Specification Group Radio Access Network; NR; Multiplexing and channel coding (Release 15)," 3GPP TS 38.212 V15.8.0 (Dec. 2019).
Third Generation Partnership Project, "Technical Specification Group Radio Access Network; NR; Multiplexing and channel coding (Release 16)," 3GPP TS 38.212 V16.0.0 (Dec. 2019).

* cited by examiner (a)

(b)

METHODS AND PROCEDURES FOR FLEXIBLE AND HIGHLY-PARALLEL POLAR ENCODING AND DECODING

CROSS REFERENCE TO RELATED APPLICATIONS

This application is the U.S. National Stage, under 35 U.S.C. § 371, of International Application No. PCT/US2020/015707, filed Jan. 29, 2020, which claims the benefit of U.S. Provisional Application Ser. No. 62/798,121, filed on Jan. 29, 2019, the contents of which is hereby incorporated by reference herein.

SUMMARY

A method performed by a wireless transmit/receive unit (WTRU) may comprise generating a polar factor graph and pruning the polar factor graph to generate a pruned factor graph. The pruned factor graph may include input variable nodes, check nodes and output variable nodes. The method may further comprise initializing the input variable nodes. For each of a plurality of encoding levels of the pruned factor graph, values from the input variable nodes may be transferred to the check nodes. Operations, for example, exclusive or (XOR) additions, may be performed on the values of the check nodes. Check nodes having a single connection to another node not used in a previous transfer may be identified. Values from the identified check nodes may be transferred to the input variable nodes. Binary values from the input variable nodes may be transferred to the output variable nodes. Binary values from the input variable nodes may be transferred to the output variable nodes for transmission to a receiver.

BRIEF DESCRIPTION OF THE DRAWINGS

A more detailed understanding may be had from the following description, given by way of example in conjunction with the accompanying drawings, wherein like reference numerals in the figures indicate like elements, and wherein.

DETAILED DESCRIPTION

Figure 1A:
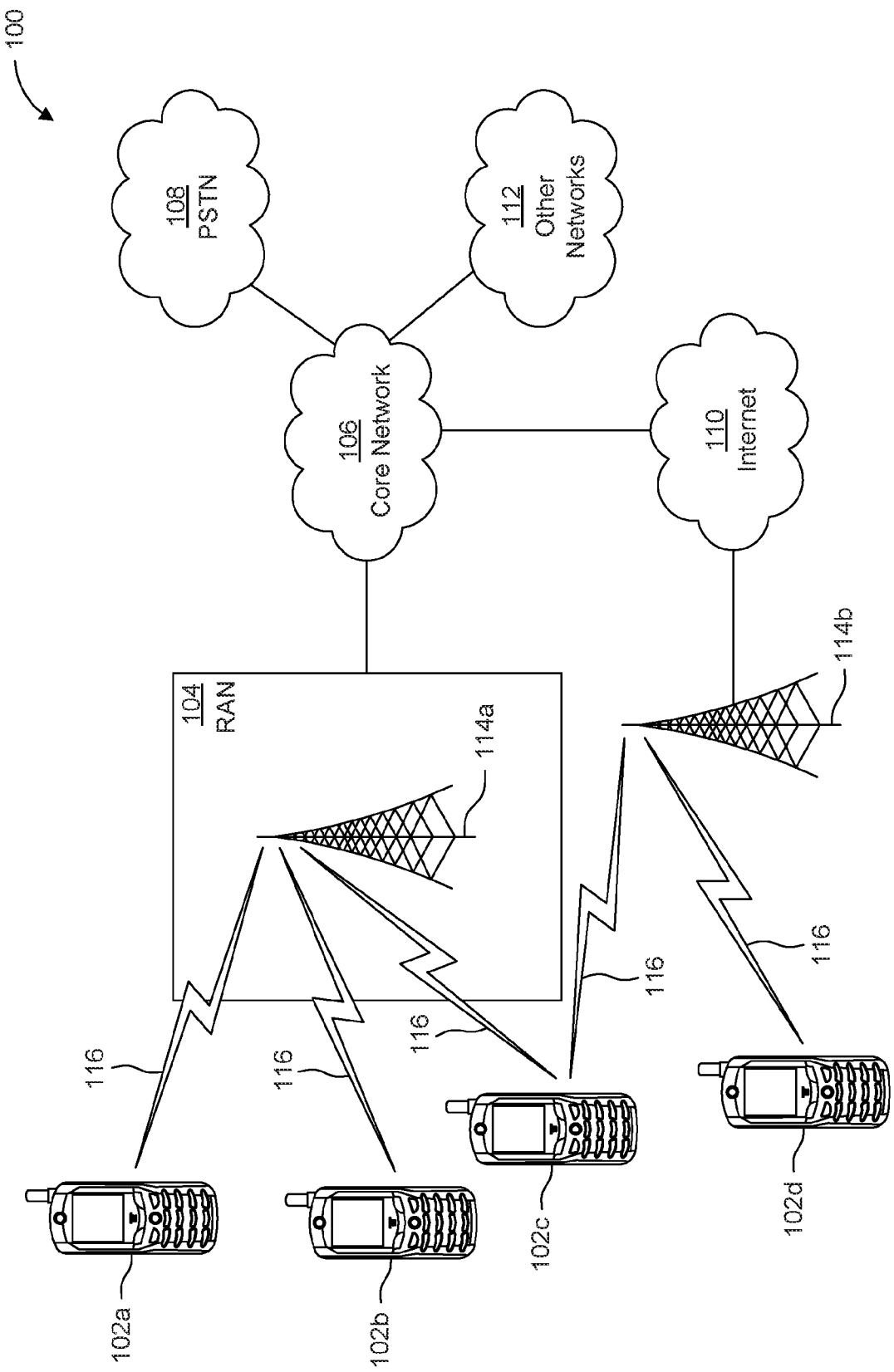
FIG. 1A is a system diagram illustrating an example communications system in which one or more disclosed embodiments may be implemented.

FIG. 1A is a diagram illustrating an example communications system 100 in which one or more disclosed embodiments may be implemented. The communications system 100 may be a multiple access system that provides content, such as voice, data, video, messaging, broadcast, etc., to multiple wireless users. The communications system 100 may enable multiple wireless users to access such content through the sharing of system resources, including wireless bandwidth. For example, the communications systems 100 may employ one or more channel access methods, such as code division multiple access (CDMA), time division multiple access (TDMA), frequency division multiple access (FDMA), orthogonal FDMA (OFDMA), single-carrier FDMA (SC-FDMA), zero-tail unique-word discrete Fourier transform Spread OFDM (ZT-UW-DFT-S-OFDM), unique word OFDM (UW-OFDM), resource block-filtered OFDM, filter bank multicarrier (FBMC), and the like.

As shown in FIG. 1A, the communications system 100 may include wireless transmit/receive units (WTRUs) 102a, 102b, 102c, 102d, a radio access network (RAN) 104, a core network (CN) 106, a public switched telephone network (PSTN) 108, the Internet 110, and other networks 112, though it will be appreciated that the disclosed embodiments contemplate any number of WTRUs, base stations, networks, and/or network elements. Each of the WTRUs 102a, 102b, 102c, 102d may be any type of device configured to operate and/or communicate in a wireless environment. By way of example, the WTRUs 102a, 102b, 102c, 102d, any of which may be referred to as a station (STA), may be configured to transmit and/or receive wireless signals and may include a user equipment (UE), a mobile station, a fixed or mobile subscriber unit, a subscription-based unit, a pager, a cellular telephone, a personal digital assistant (PDA), a smartphone, a laptop, a netbook, a personal computer, a wireless sensor, a hotspot or Mi-Fi device, an Internet of Things (IoT) device, a watch or other wearable, a head-mounted display (HMD), a vehicle, a drone, a medical device and applications (e.g., remote surgery), an industrial device and applications (e.g., a robot and/or other wireless devices operating in an industrial and/or an automated processing chain contexts), a consumer electronics device, a device operating on commercial and/or industrial wireless networks, and the like. Any of the WTRUs 102a, 102b, 102c and 102d may be interchangeably referred to as a UE.

The communications systems 100 may also include a base station 114a and/or a base station 114b. Each of the base stations 114a, 114b may be any type of device configured to wirelessly interface with at least one of the WTRUs 102a, 102b, 102c, 102d to facilitate access to one or more communication networks, such as the CN 106, the Internet 110, and/or the other networks 112. By way of example, the base stations 114a, 114b may be a base transceiver station (BTS), a NodeB, an eNode B (eNB), a Home Node B, a Home eNode B, a next generation NodeB, such as a gNode B (gNB), a new radio (NR) NodeB, a site controller, an access point (AP), a wireless router, and the like. While the base stations 114a, 114b are each depicted as a single element, it will be appreciated that the base stations 114a, 114b may include any number of interconnected base stations and/or network elements.

The base station 114a may be part of the RAN 104, which may also include other base stations and/or network elements (not shown), such as a base station controller (BSC), a radio network controller (RNC), relay nodes, and the like. The base station 114a and/or the base station 114b may be configured to transmit and/or receive wireless signals on one or more carrier frequencies, which may be referred to as a cell (not shown). These frequencies may be in licensed spectrum, unlicensed spectrum, or a combination of licensed and unlicensed spectrum. A cell may provide coverage for a wireless service to a specific geographical area that may be relatively fixed or that may change over time. The cell may further be divided into cell sectors. For example, the cell associated with the base station 114a may be divided into three sectors. Thus, in one embodiment, the base station 114a may include three transceivers, i.e., one for each sector of the cell. In an embodiment, the base station 114a may employ multiple-input multiple output (MIMO) technology and may utilize multiple transceivers for each sector of the cell. For example, beamforming may be used to transmit and/or receive signals in desired spatial directions.

The base stations 114a, 114b may communicate with one or more of the WTRUs 102a, 102b, 102c, 102d over an air interface 116, which may be any suitable wireless communication link (e.g., radio frequency (RF), microwave, centimeter wave, micrometer wave, infrared (IR), ultraviolet (UV), visible light, etc.). The air interface 116 may be established using any suitable radio access technology (RAT).

More specifically, as noted above, the communications system 100 may be a multiple access system and may employ one or more channel access schemes, such as CDMA, TDMA, FDMA, OFDMA, SC-FDMA, and the like.

For example, the base station 114a in the RAN 104 and the WTRUs 102a, 102b, 102c may implement a radio technology such as Universal Mobile Telecommunications System (UMTS) Terrestrial Radio Access (UTRA), which may establish the air interface 116 using wideband CDMA (WCDMA). WCDMA may include communication protocols such as High-Speed Packet Access (HSPA) and/or Evolved HSPA (HSPA+). HSPA may include High-Speed Downlink (DL) Packet Access (HSDPA) and/or High-Speed Uplink (UL) Packet Access (HSUPA).

In an embodiment, the base station 114a and the WTRUs 102a, 102b, 102c may implement a radio technology such as Evolved UMTS Terrestrial Radio Access (E-UTRA), which may establish the air interface 116 using Long Term Evolution (LTE) and/or LTE-Advanced (LTE-A) and/or LTE-Advanced Pro (LTE-A Pro).

In an embodiment, the base station 114a and the WTRUs 102a, 102b, 102c may implement a radio technology such as NR Radio Access, which may establish the air interface 116 using NR.

In an embodiment, the base station 114a and the WTRUs 102a, 102b, 102c may implement multiple radio access technologies. For example, the base station 114a and the WTRUs 102a, 102b, 102c may implement LTE radio access and NR radio access together, for instance using dual connectivity (DC) principles. Thus, the air interface utilized by WTRUs 102a, 102b, 102c may be characterized by multiple types of radio access technologies and/or transmissions sent to/from multiple types of base stations (e.g., an eNB and a gNB).

In other embodiments, the base station 114a and the WTRUs 102a, 102b, 102c may implement radio technologies such as IEEE 802.11 (i.e., Wireless Fidelity (WiFi), IEEE 802.16 (i.e., Worldwide Interoperability for Microwave Access (WiMAX)), CDMA2000, CDMA2000 1x, CDMA2000 EV-DO, Interim Standard 2000 (IS-2000), Interim Standard 95 (IS-95), Interim Standard 856 (IS-856), Global System for Mobile communications (GSM), Enhanced Data rates for GSM Evolution (EDGE), GSM EDGE (GERAN), and the like.

The base station 114b in FIG. 1A may be a wireless router, Home Node B, Home eNode B, or access point, for example, and may utilize any suitable RAT for facilitating wireless connectivity in a localized area, such as a place of business, a home, a vehicle, a campus, an industrial facility, an air corridor (e.g., for use by drones), a roadway, and the like. In one embodiment, the base station 114b and the WTRUs 102c, 102d may implement a radio technology such as IEEE 802.11 to establish a wireless local area network (WLAN). In an embodiment, the base station 114b and the WTRUs 102c, 102d may implement a radio technology such as IEEE 802.15 to establish a wireless personal area network (WPAN). In yet another embodiment, the base station 114b and the WTRUs 102c, 102d may utilize a cellular-based RAT (e.g., WCDMA, CDMA2000, GSM, LTE, LTE-A, LTE-A Pro, NR etc.) to establish a picocell or femtocell. As shown in FIG. 1A, the base station 114b may have a direct connection to the Internet 110. Thus, the base station 114b may not be required to access the Internet 110 via the CN 106.

The RAN 104 may be in communication with the CN 106, which may be any type of network configured to provide voice, data, applications, and/or voice over internet protocol (VoIP) services to one or more of the WTRUs 102a, 102b, 102c, 102d. The data may have varying quality of service (QoS) requirements, such as differing throughput requirements, latency requirements, error tolerance requirements, reliability requirements, data throughput requirements, mobility requirements, and the like. The CN 106 may provide call control, billing services, mobile location-based services, pre-paid calling, Internet connectivity, video distribution, etc., and/or perform high-level security functions, such as user authentication. Although not shown in FIG. 1A, it will be appreciated that the RAN 104 and/or the CN 106 may be in direct or indirect communication with other RANs that employ the same RAT as the RAN 104 or a different RAT. For example, in addition to being connected to the RAN 104, which may be utilizing a NR radio technology, the CN 106 may also be in communication with another RAN (not shown) employing a GSM, UMTS, CDMA 2000, WiMAX, E-UTRA, or WiFi radio technology.

The CN 106 may also serve as a gateway for the WTRUs 102a, 102b, 102c, 102d to access the PSTN 108, the Internet 110, and/or the other networks 112. The PSTN 108 may include circuit-switched telephone networks that provide plain old telephone service (POTS). The Internet 110 may include a global system of interconnected computer networks and devices that use common communication protocols, such as the transmission control protocol (TCP), user datagram protocol (UDP) and/or the internet protocol (IP) in the TCP/IP internet protocol suite. The networks 112 may include wired and/or wireless communications networks owned and/or operated by other service providers. For example, the networks 112 may include another CN connected to one or more RANs, which may employ the same RAT as the RAN 104 or a different RAT.

Some or all of the WTRUs 102a, 102b, 102c, 102d in the communications system 100 may include multi-mode capabilities (e.g., the WTRUs 102a, 102b, 102c, 102d may include multiple transceivers for communicating with different wireless networks over different wireless links). For example, the WTRU 102c shown in FIG. 1A may be configured to communicate with the base station 114a, which may employ a cellular-based radio technology, and with the base station 114b, which may employ an IEEE 802 radio technology.

Figure 1B:
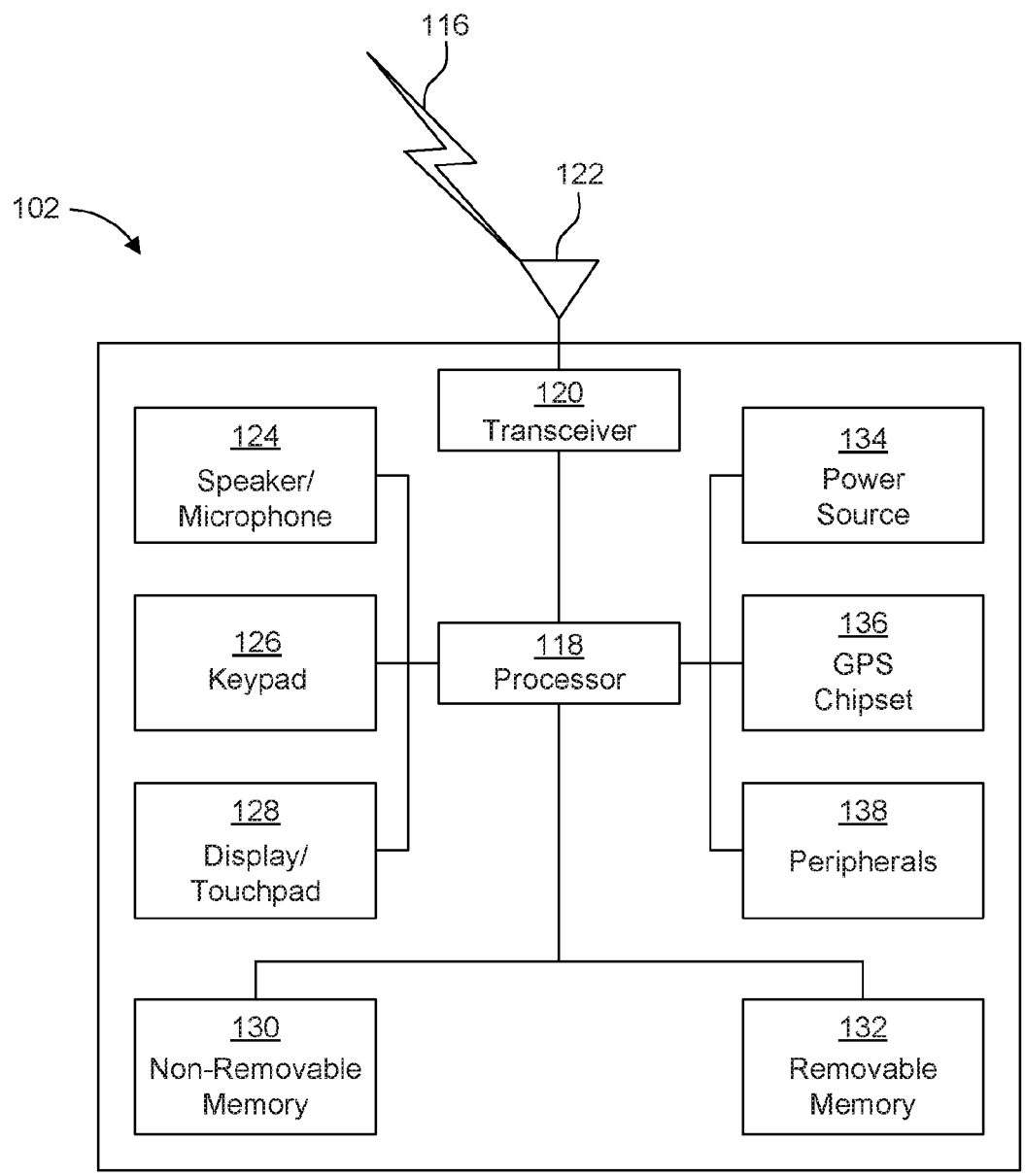
FIG. 1B is a system diagram illustrating an example wireless transmit/receive unit (WTRU) that may be used within the communications system illustrated in FIG. 1A according to an embodiment.

FIG. 1B is a system diagram illustrating an example WTRU 102. As shown in FIG. 1B, the WTRU 102 may include a processor 118, a transceiver 120, a transmit/receive element 122, a speaker/microphone 124, a keypad 126, a display/touchpad 128, non-removable memory 130, removable memory 132, a power source 134, a global positioning system (GPS) chipset 136, and/or other peripherals 138, among others. It will be appreciated that the WTRU 102 may include any sub-combination of the foregoing elements while remaining consistent with an embodiment.

The processor 118 may be a general purpose processor, a special purpose processor, a conventional processor, a digital signal processor (DSP), a plurality of microprocessors, one or more microprocessors in association with a DSP core, a controller, a microcontroller, Application Specific Integrated Circuits (ASICs), Field Programmable Gate Arrays (FPGAs), any other type of integrated circuit (IC), a state machine, and the like. The processor 118 may perform signal coding, data processing, power control, input/output processing, and/or any other functionality that enables the WTRU 102 to operate in a wireless environment. The processor 118 may be coupled to the transceiver 120, which may be coupled to the transmit/receive element 122. While FIG. 1B depicts the processor 118 and the transceiver 120 as separate components, it will be appreciated that the processor 118 and the transceiver 120 may be integrated together in an electronic package or chip.

The transmit/receive element 122 may be configured to transmit signals to, or receive signals from, a base station (e.g., the base station 114a) over the air interface 116. For example, in one embodiment, the transmit/receive element 122 may be an antenna configured to transmit and/or receive RF signals. In an embodiment, the transmit/receive element 122 may be an emitter/detector configured to transmit and/or receive IR, UV, or visible light signals, for example. In yet another embodiment, the transmit/receive element 122 may be configured to transmit and/or receive both RF and light signals. It will be appreciated that the transmit/receive element 122 may be configured to transmit and/or receive any combination of wireless signals.

Although the transmit/receive element 122 is depicted in FIG. 1B as a single element, the WTRU 102 may include any number of transmit/receive elements 122. More specifically, the WTRU 102 may employ MIMO technology. Thus, in one embodiment, the WTRU 102 may include two or more transmit/receive elements 122 (e.g., multiple antennas) for transmitting and receiving wireless signals over the air interface 116.

The transceiver 120 may be configured to modulate the signals that are to be transmitted by the transmit/receive element 122 and to demodulate the signals that are received by the transmit/receive element 122. As noted above, the WTRU 102 may have multi-mode capabilities. Thus, the transceiver 120 may include multiple transceivers for enabling the WTRU 102 to communicate via multiple RATs, such as NR and IEEE 802.11, for example.

The processor 118 of the WTRU 102 may be coupled to, and may receive user input data from, the speaker/microphone 124, the keypad 126, and/or the display/touchpad 128 (e.g., a liquid crystal display (LCD) display unit or organic light-emitting diode (OLED) display unit). The processor 118 may also output user data to the speaker/microphone 124, the keypad 126, and/or the display/touchpad 128. In addition, the processor 118 may access information from, and store data in, any type of suitable memory, such as the non-removable memory 130 and/or the removable memory 132. The non-removable memory 130 may include random-access memory (RAM), read-only memory (ROM), a hard disk, or any other type of memory storage device. The removable memory 132 may include a subscriber identity module (SIM) card, a memory stick, a secure digital (SD) memory card, and the like. In other embodiments, the processor 118 may access information from, and store data in, memory that is not physically located on the WTRU 102, such as on a server or a home computer (not shown).

The processor 118 may receive power from the power source 134, and may be configured to distribute and/or control the power to the other components in the WTRU 102. The power source 134 may be any suitable device for powering the WTRU 102. For example, the power source 134 may include one or more dry cell batteries (e.g., nickel-cadmium (NiCd), nickel-zinc (NiZn), nickel metal hydride (NiMH), lithium-ion (Li-ion), etc.), solar cells, fuel cells, and the like.

The processor 118 may also be coupled to the GPS chipset 136, which may be configured to provide location information (e.g., longitude and latitude) regarding the current location of the WTRU 102. In addition to, or in lieu of, the information from the GPS chipset 136, the WTRU 102 may receive location information over the air interface 116 from a base station (e.g., base stations 114a, 114b) and/or determine its location based on the timing of the signals being received from two or more nearby base stations. It will be appreciated that the WTRU 102 may acquire location information by way of any suitable location-determination method while remaining consistent with an embodiment.

The processor 118 may further be coupled to other peripherals 138, which may include one or more software and/or hardware modules that provide additional features, functionality and/or wired or wireless connectivity. For example, the peripherals 138 may include an accelerometer, an e-compass, a satellite transceiver, a digital camera (for photographs and/or video), a universal serial bus (USB) port, a vibration device, a television transceiver, a hands free headset, a Bluetooth® module, a frequency modulated (FM) radio unit, a digital music player, a media player, a video game player module, an Internet browser, a Virtual Reality and/or Augmented Reality (VR/AR) device, an activity tracker, and the like. The peripherals 138 may include one or more sensors. The sensors may be one or more of a gyroscope, an accelerometer, a hall effect sensor, a magnetometer, an orientation sensor, a proximity sensor, a temperature sensor, a time sensor; a geolocation sensor, an altimeter, a light sensor, a touch sensor, a magnetometer, a barometer, a gesture sensor, a biometric sensor, a humidity sensor and the like.

The WTRU 102 may include a full duplex radio for which transmission and reception of some or all of the signals (e.g., associated with particular subframes for both the UL (e.g., for transmission) and DL (e.g., for reception) may be concurrent and/or simultaneous. The full duplex radio may include an interference management unit to reduce and or substantially eliminate self-interference via either hardware (e.g., a choke) or signal processing via a processor (e.g., a separate processor (not shown) or via processor 118). In an embodiment, the WRTU 102 may include a half-duplex radio for which transmission and reception of some or all of the signals (e.g., associated with particular subframes for either the UL (e.g., for transmission) or the DL (e.g., for reception)).

Figure 1C:
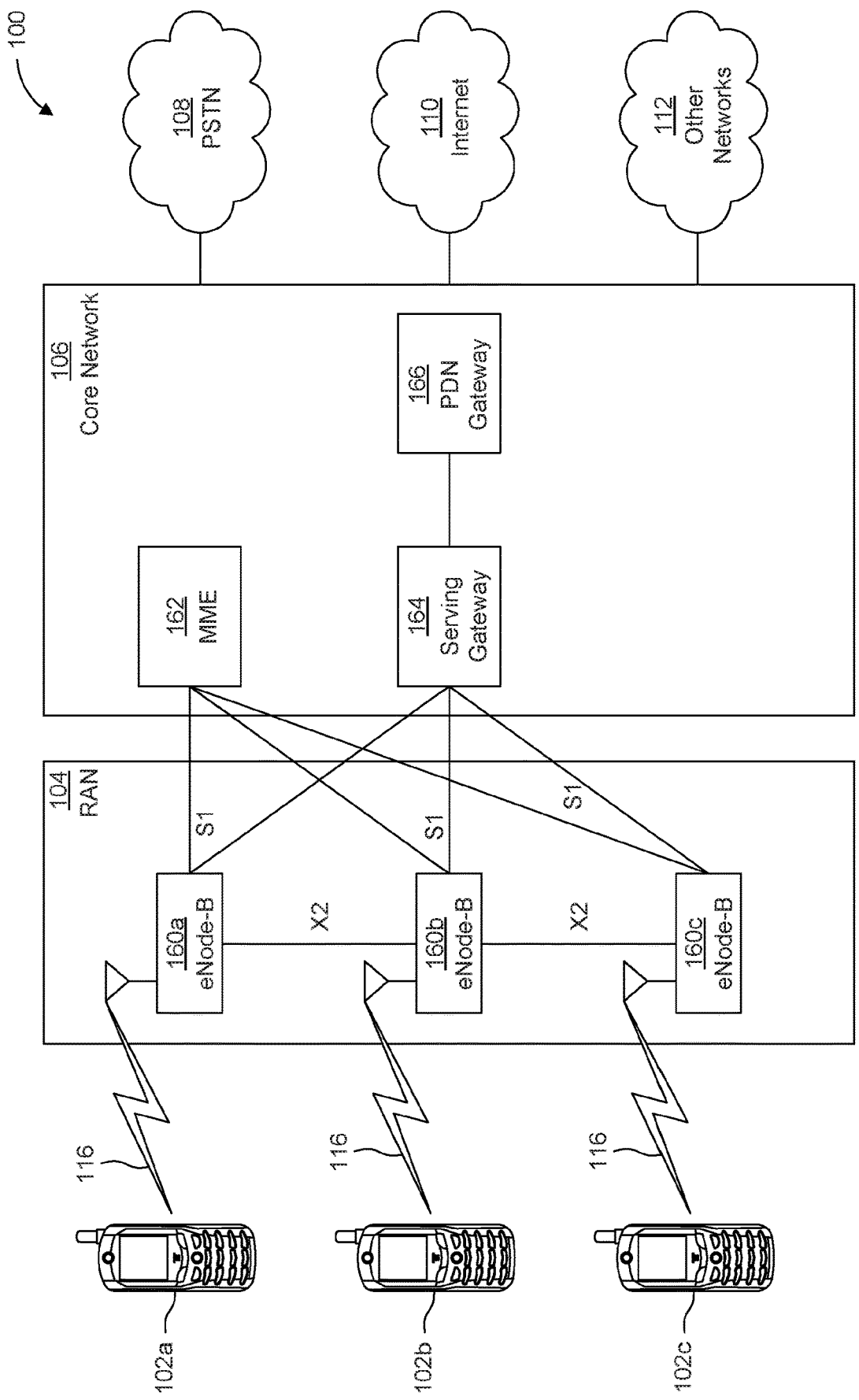
FIG. 1C is a system diagram illustrating an example radio access network (RAN) and an example core network (CN) that may be used within the communications system illustrated in FIG. 1A according to an embodiment.

FIG. 1C is a system diagram illustrating the RAN 104 and the CN 106 according to an embodiment. As noted above, the RAN 104 may employ an E-UTRA radio technology to communicate with the WTRUs 102a, 102b, 102c over the air interface 116. The RAN 104 may also be in communication with the CN 106.

The RAN 104 may include eNode-Bs 160a, 160b, 160c, though it will be appreciated that the RAN 104 may include any number of eNode-Bs while remaining consistent with an embodiment. The eNode-Bs 160a, 160b, 160c may each include one or more transceivers for communicating with the WTRUs 102a, 102b, 102c over the air interface 116. In one embodiment, the eNode-Bs 160a, 160b, 160c may implement MIMO technology. Thus, the eNode-B 160a, for example, may use multiple antennas to transmit wireless signals to, and/or receive wireless signals from, the WTRU 102a.

Each of the eNode-Bs 160a, 160b, 160c may be associated with a particular cell (not shown) and may be configured to handle radio resource management decisions, handover decisions, scheduling of users in the UL and/or DL, and the like. As shown in FIG. 1C, the eNode-Bs 160a, 160b, 160c may communicate with one another over an X2 interface.

Figure 10:
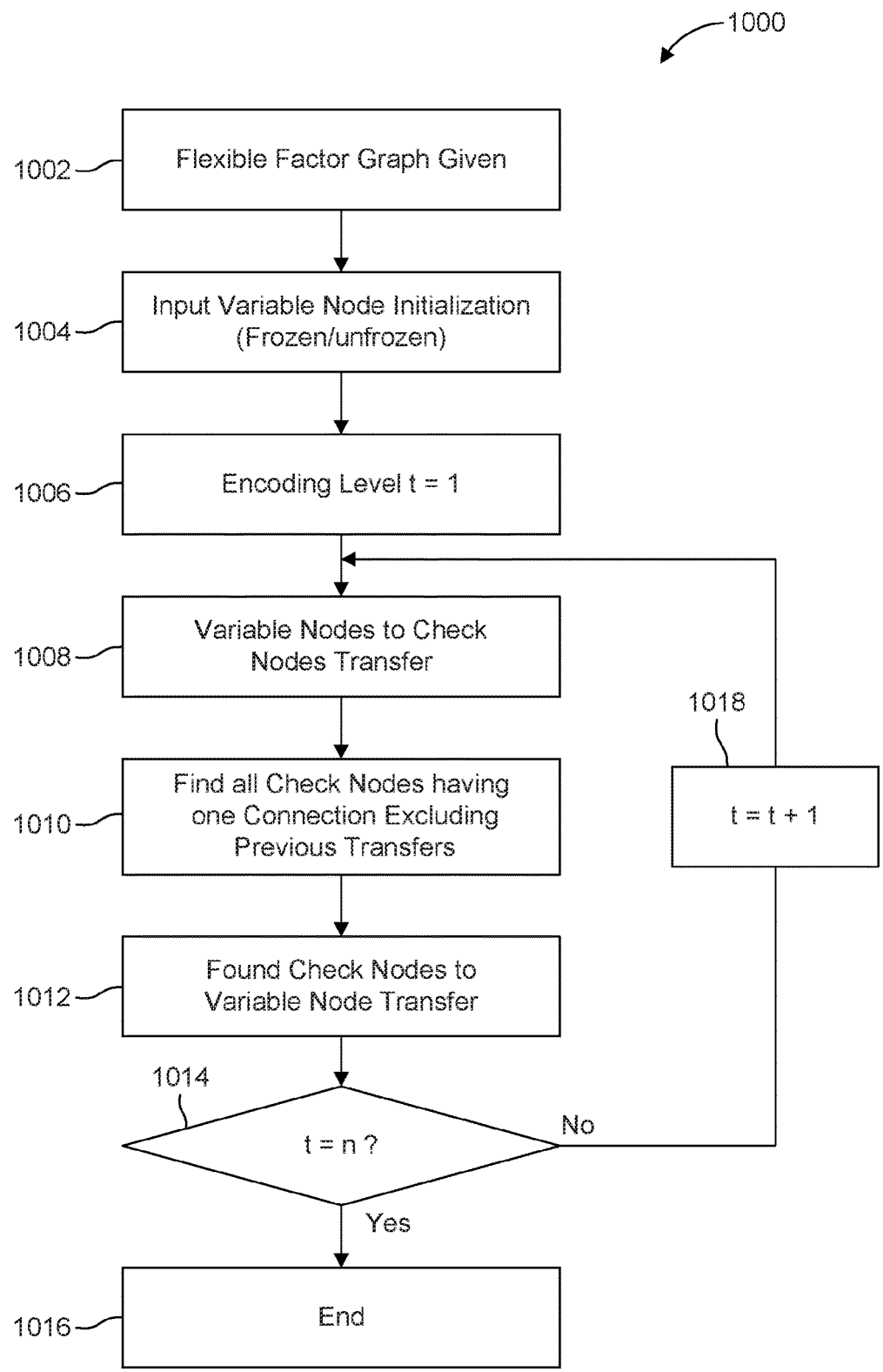
FIG. 10 is a flowchart of an encoding by the proposed flexible factor graph.

The CN 106 shown in FIG. 10 may include a mobility management entity (MME) 162, a serving gateway (SGW) 164, and a packet data network (PDN) gateway (PGW) 166. While the foregoing elements are depicted as part of the CN 106, it will be appreciated that any of these elements may be owned and/or operated by an entity other than the CN operator.

The MME 162 may be connected to each of the eNode-Bs 162a, 162b, 162c in the RAN 104 via an S1 interface and may serve as a control node. For example, the MME 162 may be responsible for authenticating users of the WTRUs 102a, 102b, 102c, bearer activation/deactivation, selecting a particular serving gateway during an initial attach of the WTRUs 102a, 102b, 102c, and the like. The MME 162 may provide a control plane function for switching between the RAN 104 and other RANs (not shown) that employ other radio technologies, such as GSM and/or WCDMA.

The SGW 164 may be connected to each of the eNode Bs 160a, 160b, 160c in the RAN 104 via the S1 interface. The SGW 164 may generally route and forward user data packets to/from the WTRUs 102a, 102b, 102c. The SGW 164 may perform other functions, such as anchoring user planes during inter-eNode B handovers, triggering paging when DL data is available for the WTRUs 102a, 102b, 102c, managing and storing contexts of the WTRUs 102a, 102b, 102c, and the like.

The SGW 164 may be connected to the PGW 166, which may provide the WTRUs 102a, 102b, 102c with access to packet-switched networks, such as the Internet 110, to facilitate communications between the WTRUs 102a, 102b, 102c and IP-enabled devices.

The CN 106 may facilitate communications with other networks. For example, the CN 106 may provide the WTRUs 102a, 102b, 102c with access to circuit-switched networks, such as the PSTN 108, to facilitate communications between the WTRUs 102a, 102b, 102c and traditional land-line communications devices. For example, the CN 106 may include, or may communicate with, an IP gateway (e.g., an IP multimedia subsystem (IMS) server) that serves as an interface between the CN 106 and the PSTN 108. In addition, the CN 106 may provide the WTRUs 102a, 102b, 102c with access to the other networks 112, which may include other wired and/or wireless networks that are owned and/or operated by other service providers.

Although the WTRU is described in FIGS. 1A-1D as a wireless terminal, it is contemplated that in certain representative embodiments that such a terminal may use (e.g., temporarily or permanently) wired communication interfaces with the communication network.

In representative embodiments, the other network 112 may be a WLAN.

A WLAN in Infrastructure Basic Service Set (BSS) mode may have an Access Point (AP) for the BSS and one or more stations (STAs) associated with the AP. The AP may have access or an interface to a Distribution System (DS) or another type of wired/wireless network that carries traffic in to and/or out of the BSS. Traffic to STAs that originates from outside the BSS may arrive through the AP and may be delivered to the STAs. Traffic originating from STAs to destinations outside the BSS may be sent to the AP to be delivered to respective destinations. Traffic between STAs within the BSS may be sent through the AP, for example, where the source STA may send traffic to the AP and the AP may deliver the traffic to the destination STA. The traffic between STAs within a BSS may be considered and/or referred to as peer-to-peer traffic. The peer-to-peer traffic may be sent between (e.g., directly between) the source and destination STAs with a direct link setup (DLS). In certain representative embodiments, the DLS may use an 802.11e DLS or an 802.11z tunneled DLS (TDLS). A WLAN using an Independent BSS (IBSS) mode may not have an AP, and the STAs (e.g., all of the STAs) within or using the IBSS may communicate directly with each other. The IBSS mode of communication may sometimes be referred to herein as an "ad-hoc" mode of communication.

When using the 802.11ac infrastructure mode of operation or a similar mode of operations, the AP may transmit a beacon on a fixed channel, such as a primary channel. The primary channel may be a fixed width (e.g., 20 MHz wide bandwidth) or a dynamically set width. The primary channel may be the operating channel of the BSS and may be used by the STAs to establish a connection with the AP. In certain representative embodiments, Carrier Sense Multiple Access with Collision Avoidance (CSMA/CA) may be implemented, for example in 802.11 systems. For CSMA/CA, the STAs (e.g., every STA), including the AP, may sense the primary channel. If the primary channel is sensed/detected and/or determined to be busy by a particular STA, the particular STA may back off. One STA (e.g., only one station) may transmit at any given time in a given BSS.

High Throughput (HT) STAs may use a 40 MHz wide channel for communication, for example, via a combination of the primary 20 MHz channel with an adjacent or nonadjacent 20 MHz channel to form a 40 MHz wide channel.

Very High Throughput (VHT) STAs may support 20 MHz, 40 MHz, 80 MHz, and/or 160 MHz wide channels. The 40 MHz, and/or 80 MHz, channels may be formed by combining contiguous 20 MHz channels. A 160 MHz channel may be formed by combining 8 contiguous 20 MHz channels, or by combining two non-contiguous 80 MHz channels, which may be referred to as an 80+80 configuration. For the 80+80 configuration, the data, after channel encoding, may be passed through a segment parser that may divide the data into two streams. Inverse Fast Fourier Transform (IFFT) processing, and time domain processing, may be done on each stream separately. The streams may be mapped on to the two 80 MHz channels, and the data may be transmitted by a transmitting STA. At the receiver of the receiving STA, the above described operation for the 80+80 configuration may be reversed, and the combined data may be sent to the Medium Access Control (MAC).

Sub 1 GHz modes of operation are supported by 802.11af and 802.11ah. The channel operating bandwidths, and carriers, are reduced in 802.11af and 802.11ah relative to those used in 802.11n, and 802.11ac. 802.11af supports 5 MHz, 10 MHz, and 20 MHz bandwidths in the TV White Space (TVWS) spectrum, and 802.11ah supports 1 MHz, 2 MHz, 4 MHz, 8 MHz, and 16 MHz bandwidths using non-TVWS spectrum. According to a representative embodiment, 802.11ah may support Meter Type Control/Machine-Type Communications (MTC), such as MTC devices in a macro coverage area. MTC devices may have certain capabilities, for example, limited capabilities including support for (e.g., only support for) certain and/or limited bandwidths. The MTC devices may include a battery with a battery life above a threshold (e.g., to maintain a very long battery life).

WLAN systems, which may support multiple channels, and channel bandwidths, such as 802.11n, 802.11ac, 802.11af, and 802.11ah, include a channel which may be designated as the primary channel. The primary channel may have a bandwidth equal to the largest common operating bandwidth supported by all STAs in the BSS. The bandwidth of the primary channel may be set and/or limited by a STA, from among all STAs in operating in a BSS, which supports the smallest bandwidth operating mode. In the example of 802.11ah, the primary channel may be 1 MHz wide for STAs (e.g., MTC type devices) that support (e.g., only support) a 1 MHz mode, even if the AP, and other STAs in the BSS support 2 MHz, 4 MHz, 8 MHz, 16 MHz, and/or other channel bandwidth operating modes. Carrier sensing and/or Network Allocation Vector (NAV) settings may depend on the status of the primary channel. If the primary channel is busy, for example, due to a STA (which supports only a 1 MHz operating mode) transmitting to the AP, all available frequency bands may be considered busy even though a majority of the available frequency bands remains idle.

In the United States, the available frequency bands, which may be used by 802.11ah, are from 902 MHz to 928 MHz. In Korea, the available frequency bands are from 917.5 MHz to 923.5 MHz. In Japan, the available frequency bands are from 916.5 MHz to 927.5 MHz. The total bandwidth available for 802.11ah is 6 MHz to 26 MHz depending on the country code.

Figure 1D:
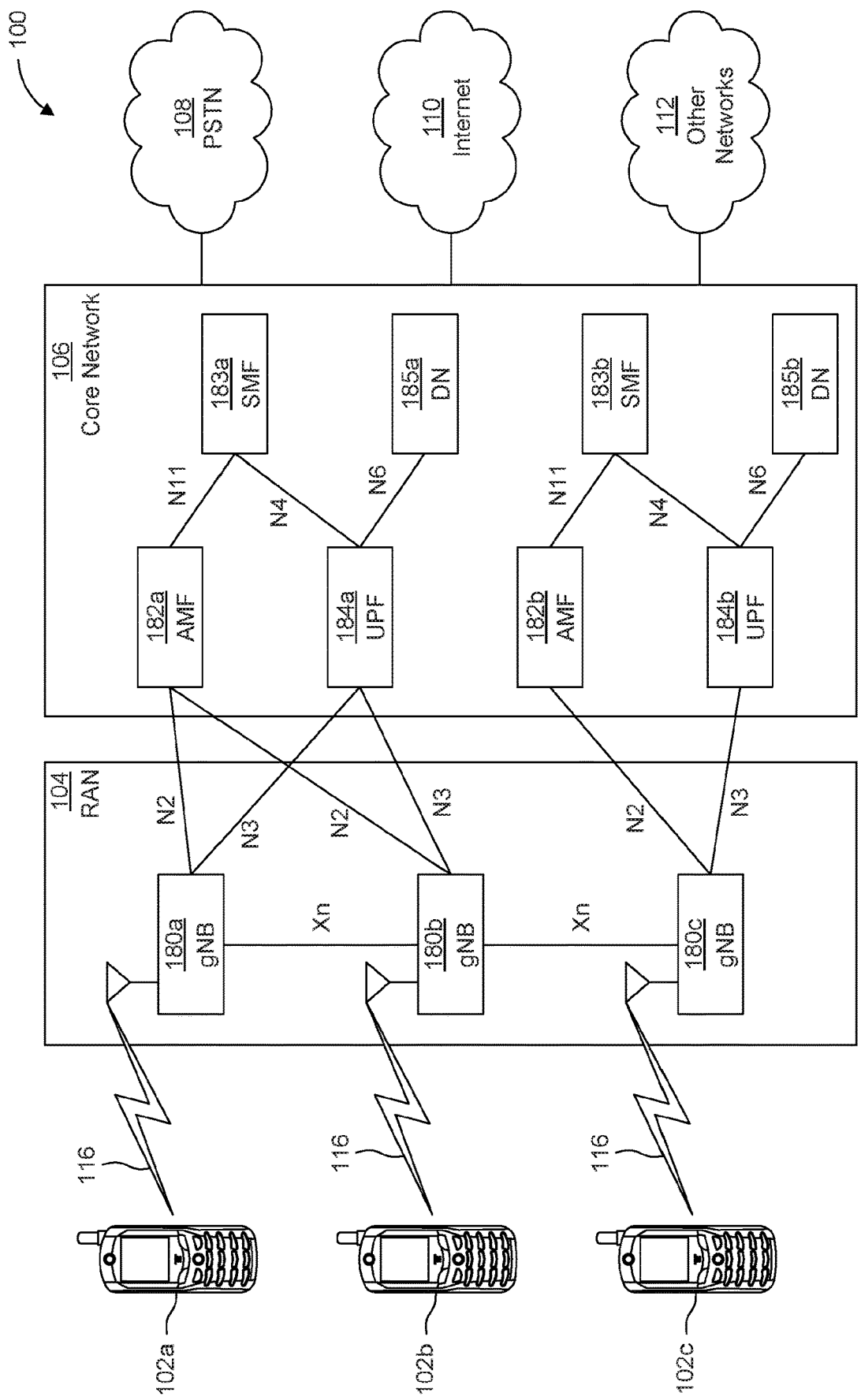
FIG. 1D is a system diagram illustrating a further example RAN and a further example CN that may be used within the communications system illustrated in FIG. 1A according to an embodiment.

FIG. 1D is a system diagram illustrating the RAN 104 and the CN 106 according to an embodiment. As noted above, the RAN 104 may employ an NR radio technology to communicate with the WTRUs 102a, 102b, 102c over the air interface 116. The RAN 104 may also be in communication with the CN 106.

The RAN 104 may include gNBs 180a, 180b, 180c, though it will be appreciated that the RAN 104 may include any number of gNBs while remaining consistent with an embodiment. The gNBs 180a, 180b, 180c may each include one or more transceivers for communicating with the WTRUs 102a, 102b, 102c over the air interface 116. In one embodiment, the gNBs 180a, 180b, 180c may implement MIMO technology. For example, gNBs 180a, 108b may utilize beamforming to transmit signals to and/or receive signals from the gNBs 180a, 180b, 180c. Thus, the gNB 180a, for example, may use multiple antennas to transmit wireless signals to, and/or receive wireless signals from, the WTRU 102a. In an embodiment, the gNBs 180a, 180b, 180c may implement carrier aggregation technology. For example, the gNB 180a may transmit multiple component carriers to the WTRU 102a (not shown). A subset of these component carriers may be on unlicensed spectrum while the remaining component carriers may be on licensed spectrum. In an embodiment, the gNBs 180a, 180b, 180c may implement Coordinated Multi-Point (CoMP) technology. For example, WTRU 102a may receive coordinated transmissions from gNB 180a and gNB 180b (and/or gNB 180c).

The WTRUs 102a, 102b, 102c may communicate with gNBs 180a, 180b, 180c using transmissions associated with a scalable numerology. For example, the OFDM symbol spacing and/or OFDM subcarrier spacing may vary for different transmissions, different cells, and/or different portions of the wireless transmission spectrum. The WTRUs 102a, 102b, 102c may communicate with gNBs 180a, 180b, 180c using subframe or transmission time intervals (TTIs) of various or scalable lengths (e.g., containing a varying number of OFDM symbols and/or lasting varying lengths of absolute time).

The gNBs 180a, 180b, 180c may be configured to communicate with the WTRUs 102a, 102b, 102c in a standalone configuration and/or a non-standalone configuration. In the standalone configuration, WTRUs 102a, 102b, 102c may communicate with gNBs 180a, 180b, 180c without also accessing other RANs (e.g., such as eNode-Bs 160a, 160b, 160c). In the standalone configuration, WTRUs 102a, 102b, 102c may utilize one or more of gNBs 180a, 180b, 180c as a mobility anchor point. In the standalone configuration, WTRUs 102a, 102b, 102c may communicate with gNBs 180a, 180b, 180c using signals in an unlicensed band. In a non-standalone configuration WTRUs 102a, 102b, 102c may communicate with/connect to gNBs 180a, 180b, 180c while also communicating with/connecting to another RAN such as eNode-Bs 160a, 160b, 160c. For example, WTRUs 102a, 102b, 102c may implement DC principles to communicate with one or more gNBs 180a, 180b, 180c and one or more eNode-Bs 160a, 160b, 160c substantially simultaneously. In the non-standalone configuration, eNode-Bs 160a, 160b, 160c may serve as a mobility anchor for WTRUs 102a, 102b, 102c and gNBs 180a, 180b, 180c may provide additional coverage and/or throughput for servicing WTRUs 102a, 102b, 102c.

Each of the gNBs 180a, 180b, 180c may be associated with a particular cell (not shown) and may be configured to handle radio resource management decisions, handover decisions, scheduling of users in the UL and/or DL, support of network slicing, DC, interworking between NR and E-UTRA, routing of user plane data towards User Plane Function (UPF) 184a, 184b, routing of control plane information towards Access and Mobility Management Function (AMF) 182a, 182b and the like. As shown in FIG. 1D, the gNBs 180a, 180b, 180c may communicate with one another over an Xn interface.

The CN 106 shown in FIG. 1D may include at least one AMF 182a, 182b, at least one UPF 184a, 184b, at least one Session Management Function (SMF) 183a, 183b, and possibly a Data Network (DN) 185a, 185b. While the foregoing elements are depicted as part of the CN 106, it will be appreciated that any of these elements may be owned and/or operated by an entity other than the CN operator.

The AMF 182a, 182b may be connected to one or more of the gNBs 180a, 180b, 180c in the RAN 104 via an N2 interface and may serve as a control node. For example, the AMF 182a, 182b may be responsible for authenticating users of the WTRUs 102a, 102b, 102c, support for network slicing (e.g., handling of different protocol data unit (PDU) sessions with different requirements), selecting a particular SMF 183a, 183b, management of the registration area, termination of non-access stratum (NAS) signaling, mobility management, and the like. Network slicing may be used by the AMF 182a, 182b in order to customize CN support for WTRUs 102a, 102b, 102c based on the types of services being utilized WTRUs 102a, 102b, 102c. For example, different network slices may be established for different use cases such as services relying on ultra-reliable low latency (URLLC) access, services relying on enhanced massive mobile broadband (eMBB) access, services for MTC access, and the like. The AMF 182a, 182b may provide a control plane function for switching between the RAN 104 and other RANs (not shown) that employ other radio technologies, such as LTE, LTE-A, LTE-A Pro, and/or non-3rd Generation Partnership Project (3GPP) access technologies such as WiFi.

The SMF 183a, 183b may be connected to an AMF 182a, 182b in the CN 106 via an N11 interface. The SMF 183a, 183b may also be connected to a UPF 184a, 184b in the CN 106 via an N4 interface. The SMF 183a, 183b may select and control the UPF 184a, 184b and configure the routing of traffic through the UPF 184a, 184b. The SMF 183a, 183b may perform other functions, such as managing and allocating UE IP address, managing PDU sessions, controlling policy enforcement and QoS, providing DL data notifications, and the like. A PDU session type may be IP-based, non-IP based, Ethernet-based, and the like.

The UPF 184a, 184b may be connected to one or more of the gNBs 180a, 180b, 180c in the RAN 104 via an N3 interface, which may provide the WTRUs 102a, 102b, 102c with access to packet-switched networks, such as the Internet 110, to facilitate communications between the WTRUs 102a, 102b, 102c and IP-enabled devices. The UPF 184, 184b may perform other functions, such as routing and forwarding packets, enforcing user plane policies, supporting multi-homed PDU sessions, handling user plane QoS, buffering DL packets, providing mobility anchoring, and the like.

The CN 106 may facilitate communications with other networks. For example, the CN 106 may include, or may communicate with, an IP gateway (e.g., an IP multimedia subsystem (IMS) server) that serves as an interface between the CN 106 and the PSTN 108. In addition, the CN 106 may provide the WTRUs 102a, 102b, 102c with access to the other networks 112, which may include other wired and/or wireless networks that are owned and/or operated by other service providers. In one embodiment, the WTRUs 102a, 102b, 102c may be connected to a local DN 185a, 185b through the UPF 184a, 184b via the N3 interface to the UPF 184a, 184b and an N6 interface between the UPF 184a, 184b and the DN 185a, 185b.

In view of FIGS. 1A-1D, and the corresponding description of FIGS. 1A-1D, one or more, or all, of the functions described herein with regard to one or more of: WTRU 102a-d, Base Station 114a-b, eNode-B 160a-c, MME 162, SGW 164, PGW 166, gNB 180a-c, AMF 182a-b, UPF 184a-b, SMF 183a-b, DN 185a-b, and/or any other device (s) described herein, may be performed by one or more emulation devices (not shown). The emulation devices may be one or more devices configured to emulate one or more, or all, of the functions described herein. For example, the emulation devices may be used to test other devices and/or to simulate network and/or WTRU functions.

The emulation devices may be designed to implement one or more tests of other devices in a lab environment and/or in an operator network environment. For example, the one or more emulation devices may perform the one or more, or all, functions while being fully or partially implemented and/or deployed as part of a wired and/or wireless communication network in order to test other devices within the communication network. The one or more emulation devices may perform the one or more, or all, functions while being temporarily implemented/deployed as part of a wired and/or wireless communication network. The emulation device may be directly coupled to another device for purposes of testing and/or performing testing using over-the-air wireless communications.

The one or more emulation devices may perform the one or more, including all, functions while not being implemented/deployed as part of a wired and/or wireless communication network. For example, the emulation devices may be utilized in a testing scenario in a testing laboratory and/or a non-deployed (e.g., testing) wired and/or wireless communication network in order to implement testing of one or more components. The one or more emulation devices may be test equipment. Direct RF coupling and/or wireless communications via RF circuitry (e.g., which may include one or more antennas) may be used by the emulation devices to transmit and/or receive data.

Polar codes are the first channel codes analytically proven to be capacity achieving. Polar codes show comparable performance to conventional low density parity check (LDPC) codes or turbo codes with low or no error floor when aided by an embedded cyclic redundancy check (CRC), particularly for small to medium block lengths. Polar coding with successive cancellation decoding requires relatively low encoding and decoding complexities. However, the decoding complexity increases in proportion to the list-size when the CRC-aided list decoding is adopted as well as the block-length of the codeword. The complexity increase becomes a central issue particularly in medium to large block-lengths, and limits the adoption of polar codes for high throughput uses, including 5G NR eMBB data rates (~20 Gbps) and above.

Due to a superior performance in small block length, polar codes have been adopted as a channel coding scheme for the 3GPP new radio (NR) standard to be used for control channel forward error correction (FEC) operations.

Polar code encoding may be defined as in Equation 1.

$$c_1^N = u_1^N G_N \qquad \text{Equation 1}$$

The codeword vector of polar code $c_1^N$ is generated by the product of the input vector $u_1^N$ and generator matrix $G_N$. $c_1^N$ and $u_1^N$ are binary vectors with length $N=2^n$, where N denotes the codeword block-length. The generator matrix $G_N$ may be defined by the Kronecker power of $$F = \begin{bmatrix} 1 & 0 \\ 1 & 1 \end{bmatrix}, \qquad \text{Equation 2}$$
$$G_N = F^{\otimes n}$$

In Equation 2, $(\ )^{\otimes n}$ represents the n-th Kronecker power of ( ). In Arikan's original paper, $G_N = B_N F^{\otimes n}$, $B_N$ denotes the bit reversing matrix and it changes the order of elements in $u_1^N = [u_1, u_2, \ldots, u_N]$. Bit reversing operations may be performed in some embodiments. Without a loss of generality, it is assumed that $G_N = F^{\otimes n}$ unless otherwise noted.

Some input bits for a polar code operation may have a fixed value, for example, usually zero, and these bits may be referred to as "frozen bits". The input indexes for the frozen bits may be represented by the set $A^c = \{a_1^c, a_2^c, a_3^c, \ldots, a_{N-K}^c\}$ and $a_j^c < a_j^c$ if $i<j$.

The remaining part of the input bits for polar coding may convey variable information bits and they are called as "unfrozen bits." The input indexes for unfrozen bits may be represented by the set $A = \{a_1, a_2, a_3 \ldots a_K\}$ and $a_i < a_j$ if $i<j$. The number of information bits or unfrozen bits is defined as K and the number of frozen bits is N−K. The code rate R of polar code may be defined as $$\frac{K}{N}.$$

The determination process of input bit indexes for frozen bits and unfrozen bits may be referred to as code construction for polar codes.

There have been several code construction methods developed for polar codes. In general, the methods initially calculate the reliability of each input bit index, and therefore have an order of bit index reliabilities before starting an encoding operation. From the obtained reliability order, the least reliable input bits are assigned as frozen bits and the remaining bits are assigned as unfrozen/information bits. The proportion of frozen and unfrozen bits are determined according to the desired code rate. With the frozen and unfrozen bit locations available, the encoding operation follows as in $c_1^N = u_1^N G_N$ of Equation 1 and is also shown in FIG. 2.

Figure 2:
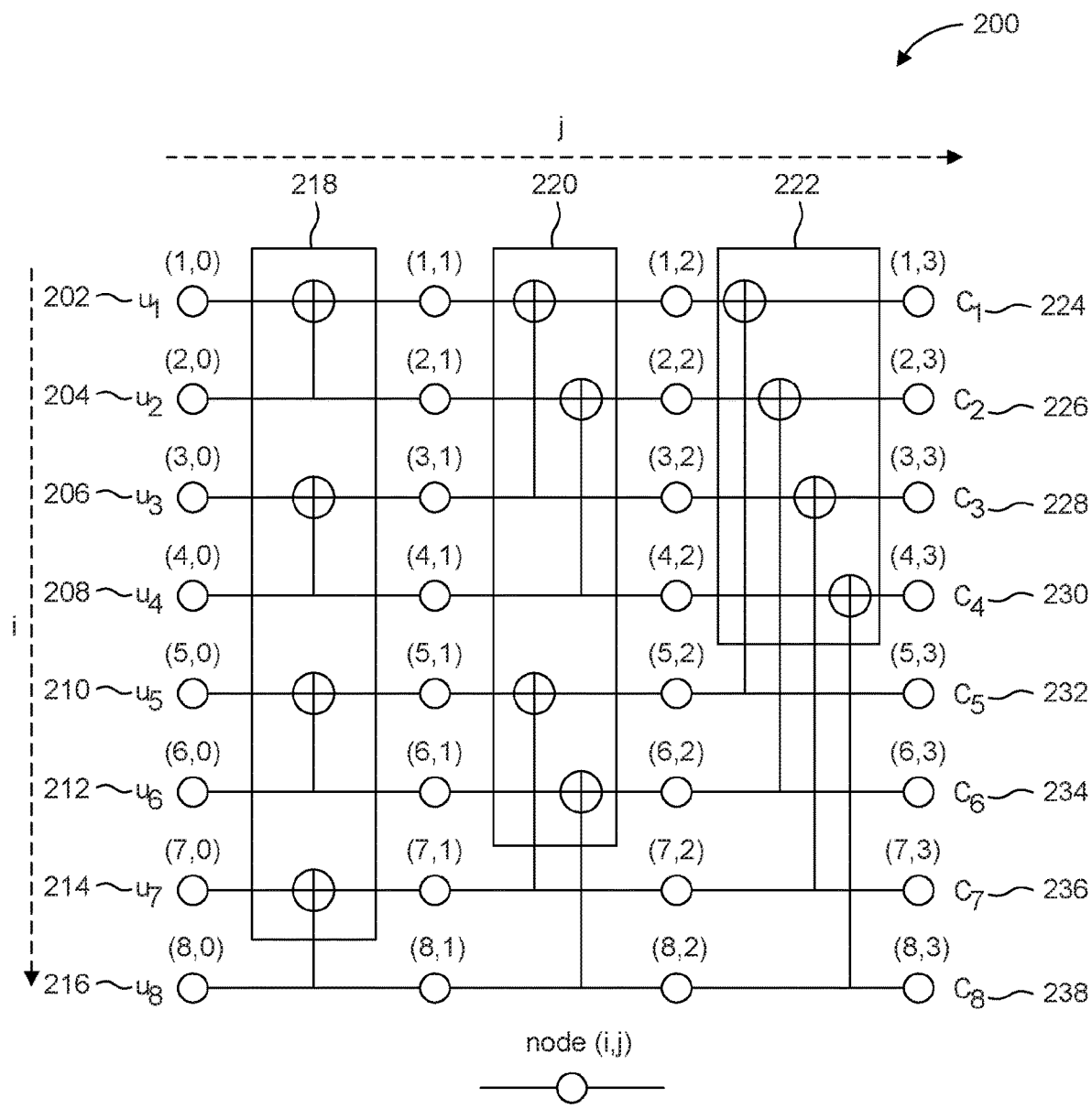
FIG. 2 is an illustration of a polar encoder with N=8.

FIG. 2 is an example which may be considered as following the polar encoder 200 described during 3GPP NR discussions. As shown in the example in FIG. 2, the polar encoder 200 may be represented by nodes denoted by (i, j), $i=1, \ldots, N$ and $j=0, \ldots, n$. In the example shown in FIG. 2, bits u1-u8 202-216 are input bits fed into the leftmost nodes. Four exclusive or (XOR) operations, for example, a bitwise addition without a carry bit, are performed in a first step 218, while another four bits flow through. Another four XOR operations are performed in a second stage 220 with another four bits flowing through. In a third stage, another four XOR operations are performed 222 with four other bits flowing through. Bits c1-c8 224-238 are output bits. Input bits 202-216 may be frozen or unfrozen, based on the coding rate.

A state-of-the-art decoding algorithm for polar codes may be categorized into two algorithms, successive cancellation (SC) based decoding and belief propagation (BP) based decoding. SC polar decoding is a sequential decoding method to calculate a log likelihood ratio (LLR) value of input bits in serial manner. It is based on the assumption that the previously decoded bits are correct and they are used for decoding the current bit. Successive cancellation list (SCL) decoding adopts several lists of candidate paths to improve the performance of SC decoding. The best list is selected according to the outcome of the LLR calculation. CRC aided successive cancellation list (CA-SCL) decoding adopts the embedded CRC as a tool to select the list. By CA-SCL decoding, polar coding may achieve error performance comparable or superior to conventional LDPC code or turbo code type coding.

In another representation, which is denoted as the factor graph representation of polar codes, polar codes may be decoded by a message passing algorithm according to the sum product algorithm or min sum algorithm. Message passing is a power technique used in various iterative based decoders, for example, within LDPC decoders and neural networks.

Belief propagation (BP) is a well-known technique that is widely used in decoding of various code-classes, including LDPC codes. An application of BP based decoding (BP decoding) for polar codes has been proposed. An improved method, referred to as LDPC-like decoding may be performed, where conventional BP decoding procedures are modified based on the features utilized in LDPC coding. Specifically, a factor graph may be pruned to have a simpler and lower complexity configuration in order to adopt the LDPC decoding characteristics. A factor graph is a bipartite graph and consists of or is comprised of two types of nodes denoted as variable nodes and check nodes, respectively.

Figure 3:
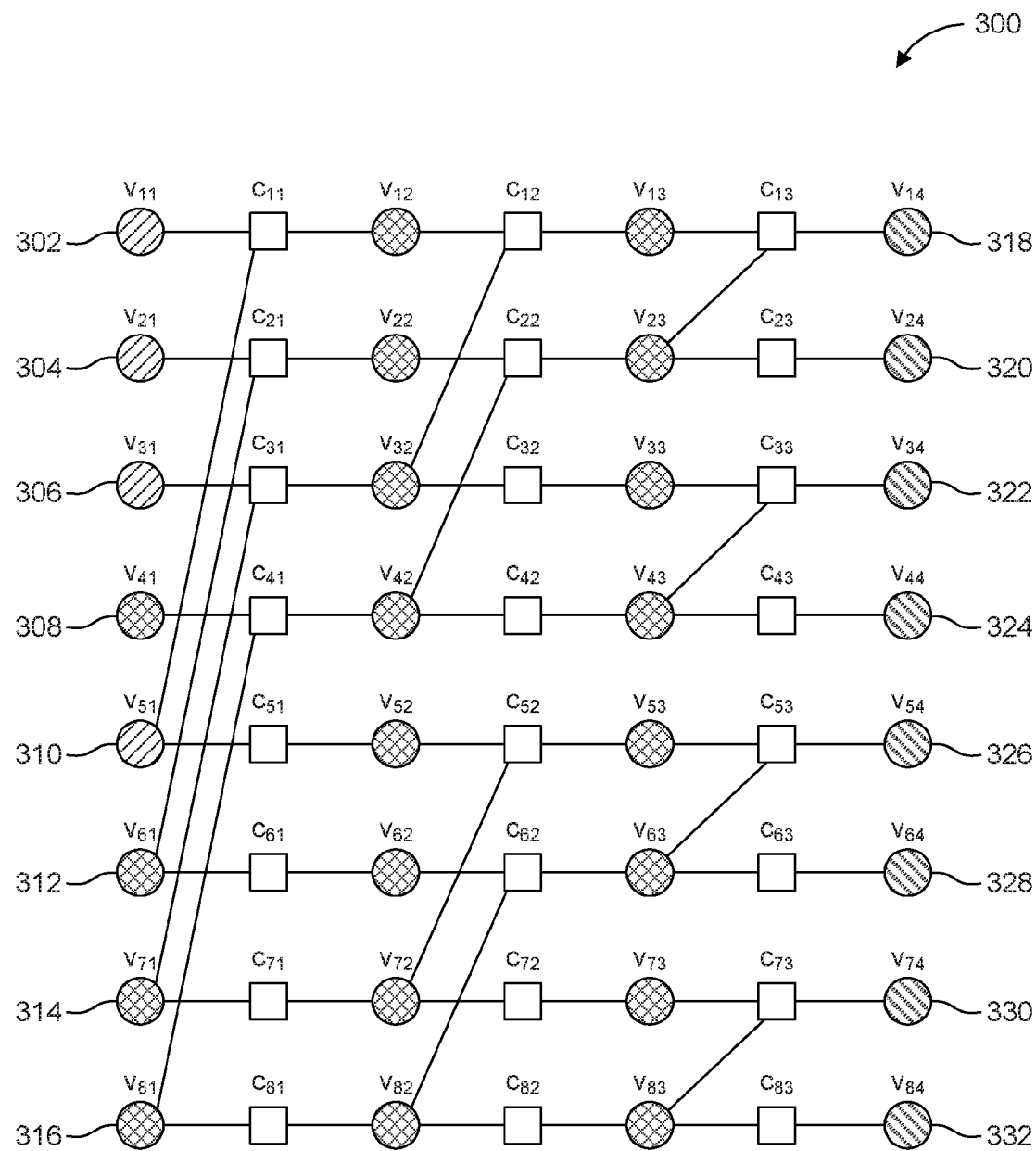
FIG. 3 is an illustration of a factor graph for belief propagation (BP) decoding with N=8.

FIG. 3 depicts the factor graph 300 for polar coding for $N = 2^n = 2^3 = 8$. The factor graph 300 has n+1 levels (e.g. stages) similar to the polar encoder 200 as shown in FIG. 2. In FIG. 3, the circles indicate variable nodes and the squares indicate check nodes. The detailed definition and functionalities of the variable nodes and checks nodes may be found in F. R. Kschischang, B. J. Frey, and H.-A. Loeliger, "Factor graphs and the sum-product algorithm," IEEE Trans. Inform. Theory, vol. 47, pp. 498-519, February 2001, incorporated by reference herein. In the leftmost level (level 0) of the factor graph 300, the variable nodes 302-316 represent the input bits, whereas in the rightmost level (level n), the variable nodes 318-332 represent the encoded output bits. Input variable nodes 302-306, 310 are frozen bits. The input nodes (input bits) are bit reversed, which results in a different sequence compared to the inputs shown in FIG. 2. This bit reversal procedure may be referred to as a bit-reversal operation.

A decoding algorithm, by message passing, for the factor graph 300 shown in FIG. 3, may be performed in an iterative manner. One iteration step may be divided into two half iteration steps. Once round trip scheduling is assumed, the first half iteration initially calculates metrics (e.g. LLR values) based on Equation 3 and Equation 4, and starts from the rightmost nodes (codeword variable nodes) and continues with the same metric calculations of Equation 3 and Equation 4, until it reaches the leftmost nodes (input bit nodes). On the other hand, the second half iteration performs metric (e.g. LLR values) calculations based on Equation 5 and Equation 6 starting from the leftmost nodes until reaching the rightmost nodes.

This configuration of half iteration follows the rule of round trip and other scheduling methods are also possible.

$$L_{i,j} = G(L_{i,j+1}, L_{i',j+1} + R_{i',j}) \quad \text{Equation 3}$$

$$L_{i',j} = G(R_{i,j}, L_{i,j+1}) + L_{L'i,j+1} \quad \text{Equation 4}$$

$$R_{i,j+1} = G(R_{i,j}, L_{i',j+1} + R_{i',j}) \quad \text{Equation 5}$$

$$R_{i',j+1} = G(R_{i,j}, L_{i,j+1}) + R_{i',j} \quad \text{Equation 6}$$

where, $G(x, y) = \text{sgn}(x)\text{sgn}(y)\min(|x|, |y|)$ and $\text{sgn}(x)$ is a sign value of x. (When $x \geq 0$, $\text{sgn}(x) = 1$ and when $x < 0$, $\text{sgn}(x) = -1$. $|x|$ is the absolute value of x.

Figure 4:
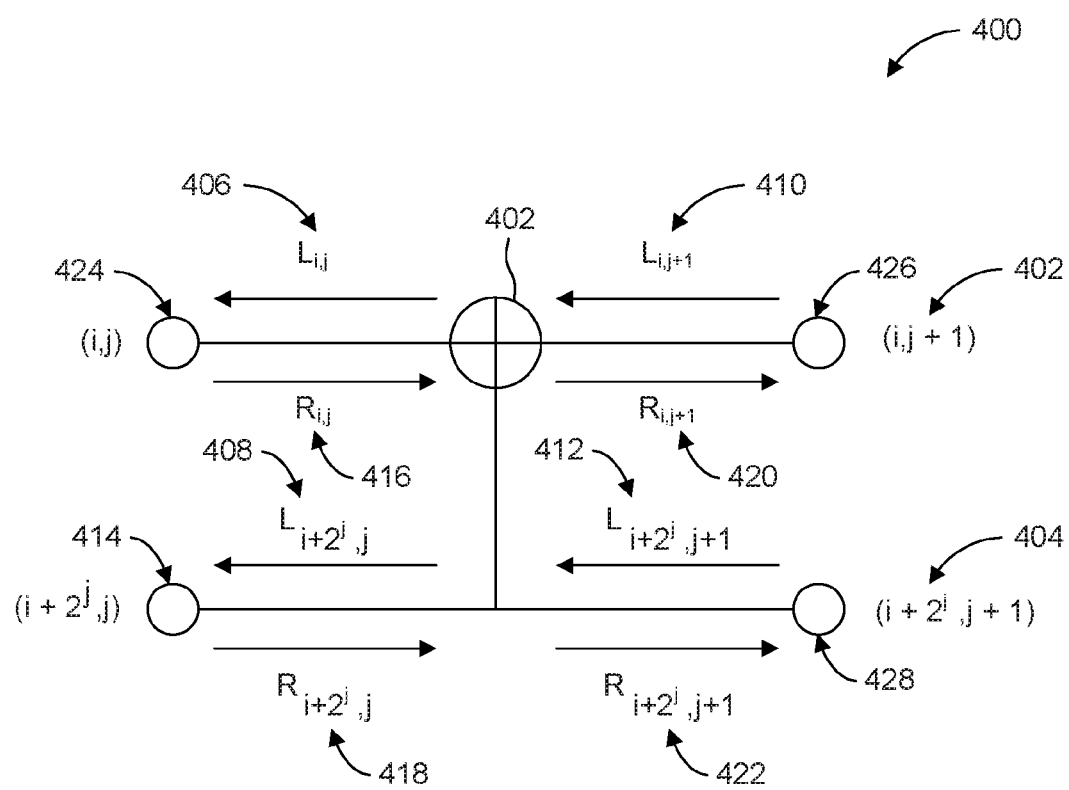
FIG. 4 is an illustration of Log-Likelihood Ratio (LLR) message passing for BP decoding.

FIG. 4 is a diagram 400 showing metric or LLR value calculations and relationships between nodes. The operation shown in FIG. 4 starts from the right-most nodes, (i,j+1) 402 and (i+$2^j$, j+1) 404 and calculates the values of $L_{i,j}$ 406 and $L_{i+2^j,j}$ 408. This is denoted as the first half iteration. In equations 3-6, i' is equivalent to i+$2^j$.

Initially, all the node values except the right-most node values are assumed to be zero. The right-most node values, $L_{i,j+1}$ 410 and $L_{i+i+2^j,j+1}$ 412 are the LLR values obtained from the wireless channel.

Then, $L_{i,j}$ 406 and $L_{i+2^j,j}$ 408, which are the values assigned to the leftmost nodes, are calculated based on the equation 3 and 4, respectively. That is, using the G formulation, the LLR values of ($L_{i,j+1}$, $L_{i',j+1} + R_{i',j}$) are input to the G formula, which outputs the $L_{i,j}$ 406 value. In the same half-iteration, $L_{i+2^j,j}$ 408 is calculated using the inputs $R_{i,j}$ 416, $L_{i,j+1}$ 410, $L_{i',j+1}$.

With the first half-iteration, the left-most node 414, 424 values are updated, and these are assigned to $R_{i,j}$ 416 and $R_{i+2^j,j}$ 418. Then, using equations 5 and 6, that is G formulation with corresponding inputs, the values $R_{i,j+1}$ 420 and $R_{i+2^j,j+1}$ 422 are calculated, and these values are assigned to the rightmost nodes 426, 428. This update may be referred to as a second half-iteration. In practice, this iterative operation may be done many times, for example, between 20-30 iterations.

BP decoding in some methods may have redundancies in structure. The pruning techniques disclosed herein may be used to remove variable nodes or check nodes which do not contribute to the decoding process.

In a factor graph representation, a length $N=2^n$ polar decoder contains n+1 stages/levels, V=(n+1)N variable nodes, and C=nN check nodes. Hence, the factor graph may be represented by a C×V parity check matrix (with size nN×(n+1)N). $VN_k$ may be defined as k-th variable node in V vector and $CN_l$ is defined as l-th check node in C vector. In case the $VN_k$ and $CN_l$ nodes are connected, then the connection is represented by a value of '1' in the ($CN_l$, $VN_k$) of parity check matrix. Otherwise, for example, in case there exists no connection between a variable node $VN_k$ and a check node $CN_l$, then the corresponding entry, ($CN_l$, $VN_k$), is represented by a value of '0'.

In addition, the degree of a variable node or a check node may be defined by the total number of connections this node has with the other nodes in the factor graph. For instance, a degree 1 variable node (VN) denotes that the variable node has only one connection with a corresponding check node, whereas a degree 2 check node (CN) denotes that the check node has 2 connections with corresponding variable nodes.

Figure 5:
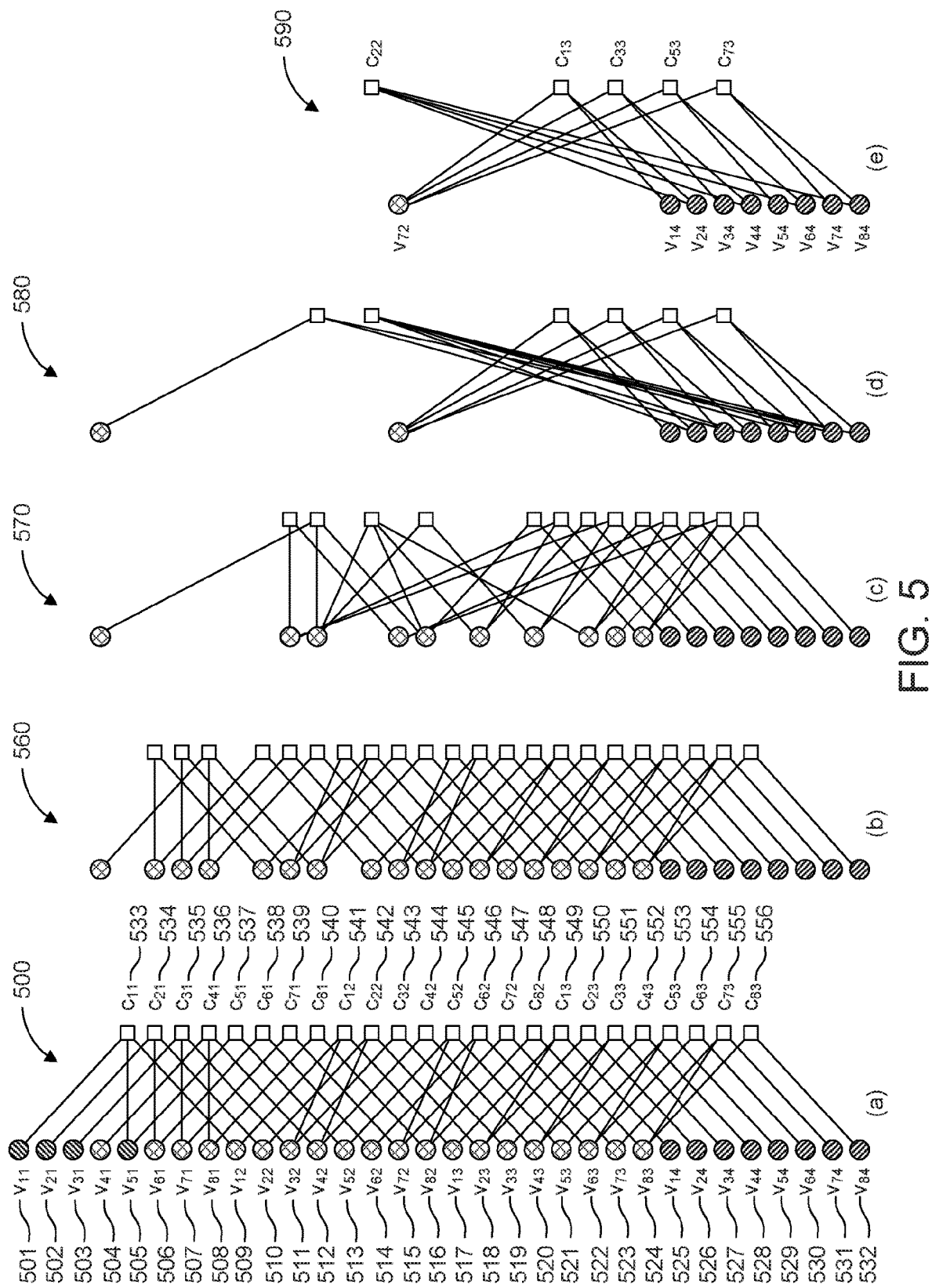
FIG. 5(a) is an illustration of a stage of an application of a pruning process with N=8.
FIG. 5(b) is an illustration of a stage of an application of a pruning process with N=8.
FIG. 5(c) is an illustration of a stage of an application of a pruning process with N=8.
FIG. 5(d) is an illustration of a stage of an application of a pruning process with N=8.
FIG. 5(e) is an illustration of a stage of an application of a pruning process with N=8.

FIG. 5 is a representation of five stages (a) 500, (b) 560, (c) 570, (d) 580, and (e) 590. The leftmost figure/stage (a) is equivalent to the factor graph 300 of a Polar code with length N=8 as shown in FIG. 3. The leftmost stage (a) 500 shows variable nodes $v_{11} \ldots v_{84}$ 501-532 and check nodes $c_{11} \ldots c_{83}$ 533-556. In each of the five steps 500-590, a manipulation occurs, which preserves the connections between the variable and check nodes of the original factor graph 300 representation. The fully connected graph is pruned in steps (b) 560, (c) 570, (d) 580, and (e) 590. Hence, each stage corresponds to one pruning procedure. The rightmost stage (e) 590 corresponds to fully pruned graph, which does not lead to additional simplifications. The fully pruned graph (e) 590 includes variable nodes $v_{72}$, $v_{14}$, $v_{24}$, $v_{34}$, $v_{44}$, $v_{54}$, $v_{64}$, $v_{74}$, $v_{84}$ 515, 525, 526, 527, 528, 530, 531, 532 and check nodes $c_{22}$, $c_{13}$, $c_{33}$, $c_{53}$, $c_{73}$ 542, 549, 551, 555.

The five steps (a)-(e) 500, 560, 570, 580, 590 shown in FIG. 5 illustrate an application of a pruning process, N=8. There are three types of variable nodes shown: 1. Channel variable nodes (VNCH) $V_{14}$ 525, $V_{24}$ 526, $V_{34}$ 527, $V_{44}$ 528, $V_{54}$ 529, $V_{64}$ 530, $V_{74}$ 531, $V_{84}$ 532, correspond to the codeword bit (or symbol) positions in FIG. 5. These nodes are initialized by LLR values calculated from received channel symbols; 2. Hidden variable nodes (VNH) which are nodes that do not have any prior metric information, e.g. LLR values, include nodes $V_{41}$ 504, $V_{61}$ 506, $V_{71}$ 507, $V_{81}$ 508, $V_{12}$ 509, $V_{22}$ 510, $V_{32}$ 511, $V_{42}$ 512, $V_{52}$ 513, $V_{62}$ 514, $V_{72}$ 515 $V_{82}$ 516, $V_{13}$ 517, $V_{23}$ 518 $V_{33}$ 519, $V_{43}$ 520, $V_{53}$ 521, $V_{63}$ 522, $V_{73}$ 523, $V_{83}$ 524 in FIG. 5. These nodes are initialized by LLR values of 0; 3. Frozen variable nodes $V_{11}$ 501, $V_{21}$ 502, $V_{31}$ 503, $V_{51}$ 505 correspond to the frozen input bits. These nodes are initialized by infinite LLR values.

Example pruning process steps, applied to the factor graph of the decoder, as shown in FIG. 5, may be summarized as: 1) Frozen nodes: remove the frozen variable nodes; 2) Degree 1 check nodes (CN): Remove the degree-1 CNs and their connected VNs; 3) Degree-1 VNCH and degree-2 CN: Remove the degree-2 CNs connected to degree-1 VNCHs. Then, merge the degree-1 VNCHs with the VNHs connected to this degree-2 CNs with; 4) Degree-1 VNH: Remove the degree-1 VNHs and the CN nodes connected to these VNHs; 5) Degree-2 VNH: Remove the degree-2 VNHs and merge the corresponding two CNs into a newly created CN. 6) Degree-2 CN: Remove the degree-2 CNs and merge the two VNHs connected to these CNs into a newly created VNH.

In an embodiment, the pruning process identifies nodes, for example, VNHs, VNCHs and CNs, with particular connection types, for example, degree 1, degree 2, etc. which do not contribute to the decoding procedure, but instead are redundant operations. In fact, since they are redundant, they may incur delay and unnecessary power consumption in the overall decoding process. For example, frozen nodes are always assumed to have 0 value, hence they do not contribute to decoding. So, these nodes can be removed. In step 2, for degree 1 CNs, the parity check equation of a CN may only be fulfilled if and only if a connected VN has a value of 0, which makes CN=0. Hence, similarly, it does not contribute to the decoding process. All the remaining steps, 3-6, may also correspond to redundant operations. These steps are independent of each other, and the pruning process given in the figure above include one or more of these at each stage. Pruning steps are further disclosed by S. Cammerer, M. Ebada, A. Elkelesh and S.

Brink, "Sparse Graphs for Belief Propagation Decoding of Polar Codes," 2018 IEEE International Symposium on Information Theory (ISIT), Vail, CO, USA, 2018, pp. 1465-1469, which is incorporated by reference herein.

Using the above pruning technique, the factor graph of the polar decoder as well as the parity check matrix corresponding to this factor graph may be modified.

Conventional LDPC decoding methods are mostly performed based on message passing algorithms. The sum product algorithm (SPA) and min sum algorithm (MSA) are foremost message passing based algorithms used in LDPC decoding. In both approaches, multiple iterations of the algorithm are performed before the completion of decoding operations corresponding to one received codeword block is typical. One iteration may consist of or may be comprised of two procedures of LLR message passing, variable nodes to check nodes and check nodes to variable nodes. It may be represented by the following equations.

$$y_{c \to v} = \prod_{v' \in \{V_c/v\}} \operatorname{sgn}(x_{v' \to c}) \cdot \phi\left(\sum_{v' \in \{V_c/v\}} \phi(|x_{v' \to c}|)\right) \quad \text{Equation 7}$$

$$x_{v \to c} = L_v^{init} + \sum_{c' \in \{C_v/c\}} y_{c' \to v} \quad \text{Equation 8}$$

$$\phi(x) = \phi^{-1}(x) = -\log\left(\tanh\left(\frac{x}{2}\right)\right) \quad \text{Equation 9}$$

where $y_{c \to v}$ is the LLR message from check node c to variable node v, $x_{v \to c}$ is the LLR message from variable node v to check node c. $V_c$ is the set of variable nodes connected to a check node c and $C_v$ is the set of check nodes connected to a variable node v. $\{V_c/v\}$ is the remaining set after removing v from $V_c$.

After a maximum number of iterations or after satisfying an early stopping criterion, the decoding is stopped. The early stopping criterion ensures the halt of the iteration stage before reaching the maximum number of iterations. Here, a known criterion calculates the product of output code bit vector and parity check matrix. If the product is equal to zero, the iterations are stopped. Then, the final code bits, a hard decision of values in output nodes, may be encoded, for example, by multiplying the output code bit vector by a generator matrix in order to acquire the decoded input bits.

A method denoted as LDPC-like BP decoding may improve the decoding latency of conventional BP decoding of polar codes. An LDPC-like BP decoding method may requires a predetermined and unique pruning procedure for each code rate or number of unfrozen bits to obtain a sparse factor graph and corresponding parity check matrix. Under flexible code rate and rate-matched code block length applications, which are features of conventional wireless systems, the pruning procedure may not be implemented with an acceptable complexity and latency by some methods.

Therefore, new methods and procedures to obtain a flexible factor graph and a corresponding parity check matrix to be used in polar encoding and decoding may be necessary. An extension method based on polar decomposition is also proposed to provide simple configuration of large polar factor graphs or parity check matrices by simple component factor graphs or parity check matrices.

In an embodiment, a factor graph and a corresponding parity-check matrix may be generated for polar encoding and decoding operations, where the factor graph is a pruned version of the conventional polar factor graph. A pruning method may involve minimizing a size of the factor graph, for example, minimizing the connections between the factor graph nodes. Variable nodes of the factor graph that correspond to input bits may be excluded from the pruning operation. A polar encoding operation with the pruned factor graph may be executed such that a particular order in output code bits is generated at the encoder and transmitted over the channel. Depending on the desired code rate and code length parameters at the encoder and decoder, the number of input bits may be adjusted by initializing frozen bits or pruning the columns in the parity check matrix that correspond to the frozen bits. A polar code may be decomposed into multiple component polar codes, and for each component polar decoder, using a corresponding pruned factor graph in decoding the totality of the polar code.

Figure 6:
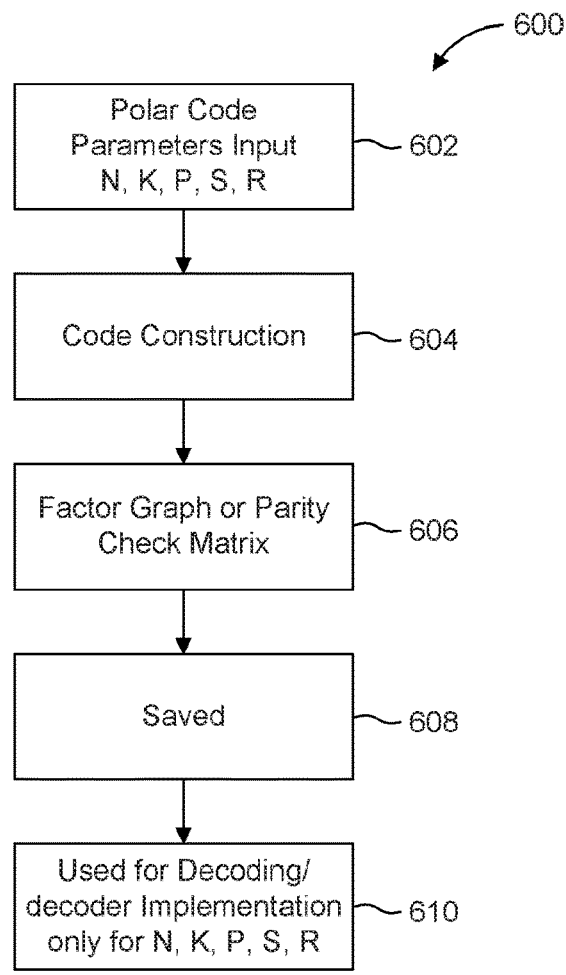
FIG. 6(a) is an flowchart demonstrating a conventional low-density parity-check (LDPC)-like BP decoding/decoder implementation.
FIG. 6(b) is an flowchart of a proposed LDPC-like BP decoding/decoder implementation.
Figure 6:
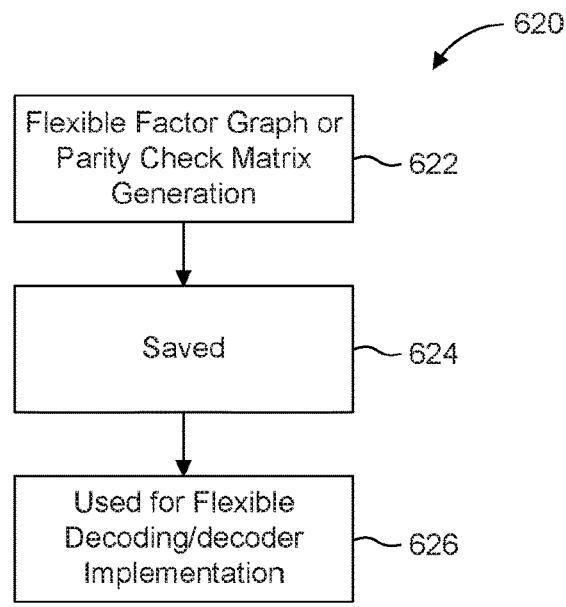

A comparison of conventional vs flexible factor graphs for LDPC-like BP decoding is made by FIG. 6. FIG. 6(a) shows the structure of a conventional LDPC-like BP decoding and decoder implementation 600. With the necessary parameters, for example, input bit length (K), code length (N), available 602 and given to the encoder, the code construction procedure 604 decides the positions of frozen and unfrozen bits in the polar encoding. The code construction may be further influenced by a rate-matching algorithm to impose puncturing, shortening or repetition to have a flexible code size, for example, denoted with the parameters puncturing number (P), shortening number (S) and repetition number (R). After code construction, a conventional pruning may provide a sparse factor graph and corresponding sparse parity check matrix 606. The information indicating the sparse factor graph (the sparse parity check matrix) are saved 608 to be used in the decoding based on LDPC-like BP procedure 610. The conventional LDPC-like BP decoding requires a separate pruning process for each instance of N, K, P, S and R. This requirement makes the conventional LDPC-like BP decoding impractical for use cases of flexible code rate and size because of a large memory requirement.

FIG. 6(b) shows a procedure of a LDPC-like BP decoding process 620. Without depending on the specific code construction by N, K, P, S and R, a flexible factor graph (parity check matrix) is produced 622 by a modified pruning process via the proposed process. The modified, for example, flexible, factor graph (parity check matrix) may be used for LDPC-like BP decoding. In the proposed method, only one factor graph (parity check matrix) for a given code length N needs to be saved 624, based on the proposed off-line pruning process. Also, the factor graph may be flexibly used 626 for arbitrary K, P, S and R.

In order to perform adaptive LDPC-like BP decoding, the factor graph shown in FIG. 3 may need to be modified into a sparse parity check matrix particularly to reduce the complexity of decoding. There are several techniques that may be used to prune the factor graph, where the corresponding parity check matrix may be acquired directly from the pruned factor graph. The pruned factor graph and the corresponding parity check matrix do not include input variable nodes. An input variable node denotes a variable node in the factor graph which has and provides the input bit value of polar code. These values also correspond to the unfrozen bits, e.g. $v_{41}$ 308, $v_{61}$ 312, $v_{71}$ 314, $v_{81}$ 316, shown in FIG. 3. However, by limiting the number of input variable nodes to be removed in the factor graph, for example, introducing a pruning range, a new modified factor graph and corresponding parity check matrix may be generated. From this modified parity check matrix, a modified polar encoder/decoder may be obtained.

The steps for a modified pruning procedure, with modifications applied, are given herein. 1) Frozen nodes: frozen nodes may be removed from the factor graph. Frozen nodes may not necessarily be removed. 2) Degree 1 check nodes (CN): The degree-1 CNs and the connected VNs are removed from the factor graph. There may or may not actually be a change. 3) Degree-1 VNCH and degree-2 CN: the degree-2 CNs connected to degree-1 VNCHs are removed and the VNHs connected to the removed degree-2 CNs are merged with the degree-1 VNCHs. There may or may not actually be a change. 4) Degree-1 VNH: The degree-1 VNH and the CN nodes connected to the degree-1 VNH are removed. The degree-1 VNH nodes, except input bit VNH nodes and CN nodes connected to the degree 1 VNH nodes, are removed. The input bit variable nodes correspond to the variable nodes at level 0 in FIG. 2 or FIG. 3. 5) Degree-2 VNH: The degree-2 VNH node may be removed and both CNs connected to the degree-2 VNH may be merged into one CN. The degree-2 VNH except input bit VNH may be removed and two CNs connected to the degree-2 VNH may be merged into one CN. 6) Degree-2 CN: The degree-2 CN may be removed and two VNHs connected to the degree-2 CN may be merged into one VNH. There may or may not actually be a change.

Figure 7:
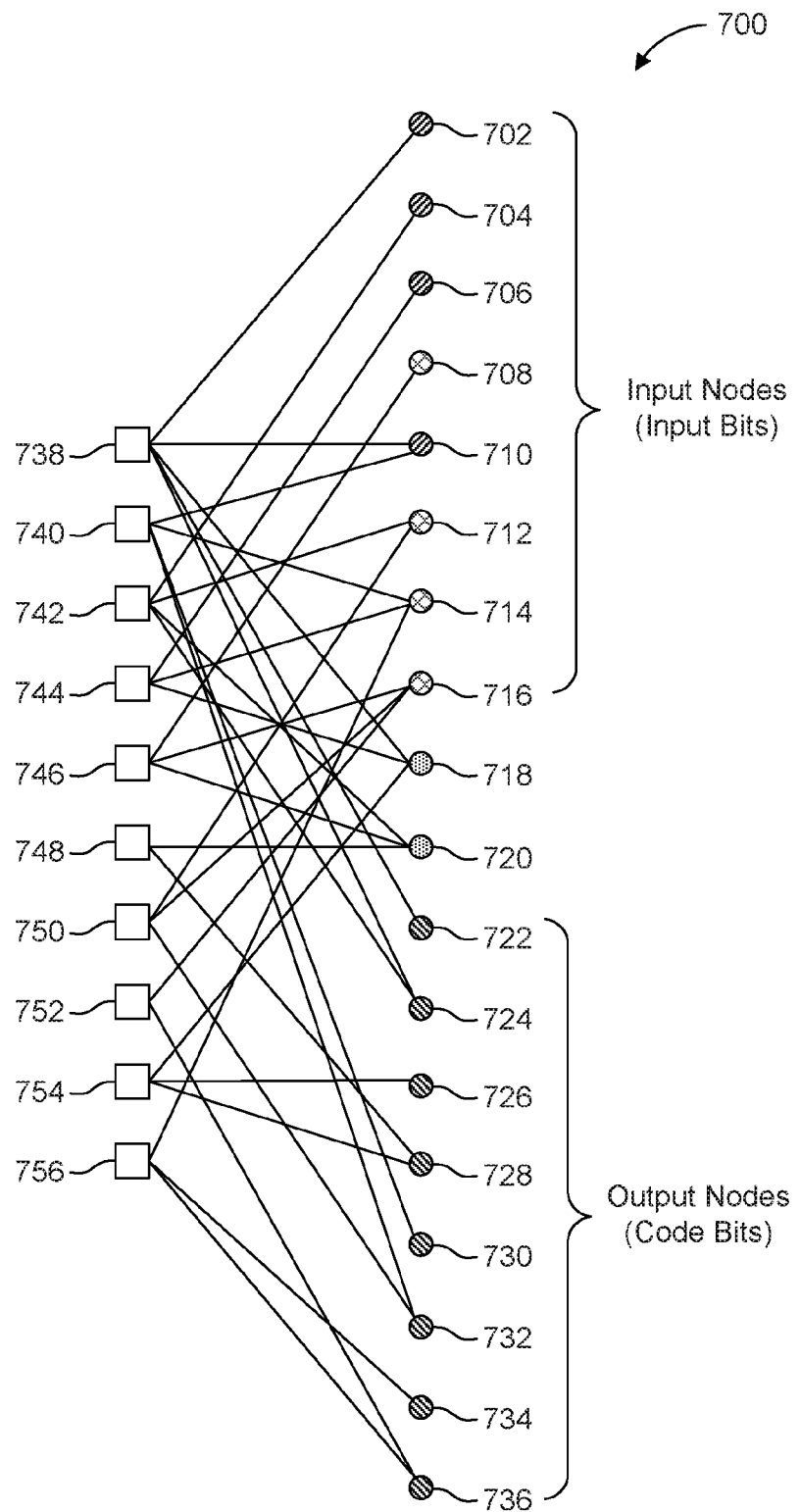
FIG. 7 is an illustration of a pruned factor graph.

FIG. 7 shows an example of a flexible and modified matrix 700. The matrix 700 has been modified by the proposed pruned factor graph for a matrix of (10,18) for N=8 polar codes. The first N=8 variable nodes 702-716 illustrated by uppermost circles in the FIG. 7 correspond to input bits $u_1, \ldots, u_8$ and the last N=8 variable nodes 722-736 shown by the lower most circles, correspond to output code bits $c_1, \ldots, c_8$. Two hidden nodes 718-720 also exist in the graph. Check nodes 738-756 are linked to variable nodes 702-736.

The corresponding modified flexible parity check matrix generated by the proposed method for N=8 is given as:

$$H = \begin{bmatrix} 100010001011000000 \\ 000010100000001100 \\ 010001000101000000 \\ 001000101000000000 \\ 000100010100000000 \\ 000000000100010000 \\ 000001010000000100 \\ 000000010000000001 \\ 000000001000 \\ 000110 \\ 000000100000000011 \end{bmatrix}$$

The size of parity check matrices generated by the proposed method are summarized in Table 1.

TABLE 1

Size of the flexible parity check matrix

| N | matrix size |
| --- | --- |
| 8 | (10, 18) |
| 16 | (24, 40) |
| 32 | (56, 88) |
| 64 | (128, 192) |
| 128 | (288, 416) |
| 256 | (640, 896) |
| 512 | (1408, 1920) |
| 1024 | (3072, 4096) |
| 2048 | (6656, 8704) |
| 4096 | (14336, 18432) |

In one option, conventional polar encoding may be coupled with a flexible LDPC-like BP decoding. In another option, polar encoding may also be implemented based a flexible factor graph (parity matrix). The polar encoding by the proposed flexible factor graph (parity check matrix) may provide new patterns of code bit generation and an order.

In polar encoding procedures with flexible factor graph, in one option, initialization of frozen bits with zero (null) values may be performed for the pruned factor graph or pruned parity check matrix. Such initialization method corresponds to a similar operation as used in the conventional polar encoding to ensure flexibility of variable length of the input bits. In a conventional pruning method, the initialization of frozen bits may not be possible for the input nodes since, due to the pruning operation, no input variable nodes exist for encoding. In another option, once the flexible factor graph and the corresponding parity check matrix are created, the columns corresponding to frozen nodes may be removed in polar encoding or decoding process depending on the required code rate or input bit numbers. These two options are used to provide flexibility in the number of unfrozen bits, K.

Moreover, in addition to the number of unfrozen bits, the code rate and code length flexibility may require the option of flexible selection of the frozen bit indices in the polar code construction. This therefore implies a modified parity check matrix and a modified factor graph which support flexible frozen input bit positions and flexible unfrozen input bit positions. In a factor graph and parity check matrix, the positions of the frozen input bits and unfrozen input bits are fixed before a pruning process, hence they cannot be adapted to different possible code rates or code block lengths. In an embodiment, the full rate (code rate 1) factor graph and parity check matrix are provided for general use of flexible code rates and code block lengths. The full rate factor graph corresponds to the case where all inputs nodes are assigned for information (unfrozen) bits initially, and by including frozen nodes into the selected graph, the desired code rate and code length may be obtained. The flexible frozen and unfrozen bits also may provide the flexibility for rate matching via puncturing, shortening and repetition.

Figure 8:
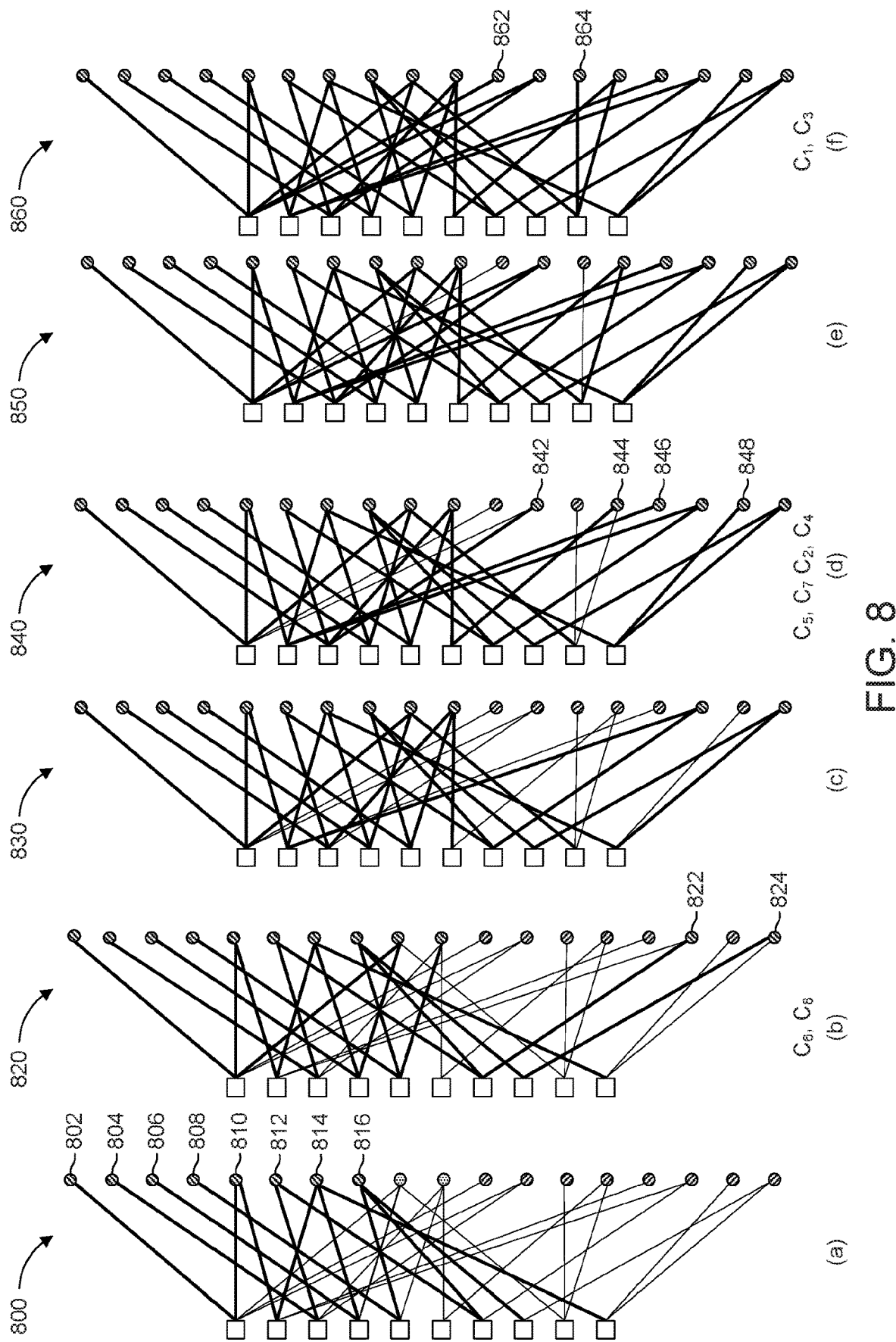
FIG. 8(a) is an illustration of a modified encoding process performed using a pruned factor graph.
FIG. 8(b) is an illustration of a modified encoding process performed using a pruned factor graph.
FIG. 8(c) is an illustration of a modified encoding process performed using a pruned factor graph.
FIG. 8(d) is an illustration of a modified encoding process performed using a pruned factor graph.
FIG. 8(e) is an illustration of a modified encoding process performed using a pruned factor graph.
FIG. 8(f) is an illustration of a modified encoding process performed using a pruned factor graph.

FIG. 8 is an illustration of a polar code encoding operation, having a plurality of steps including (a) 800, (b) 820, (c) 830, (d) 840, (e) 850 and (f) 860 using a pruned factor graph. The polar code encoding process includes a procedure of generating code bits from input bits. Thus, the process starts with input variable nodes 802-816 in FIG. 8(a) 800. The encoding steps are sequential and the encoding timing steps based on flexible factor graph also requires $n(=\log_2 N)$ as in the standard polar encoding. One half timing step in encoding corresponds to variable node to check node transfer of binary information and the other half timing step in encoding corresponds to check node to variable node transfer of binary information. For instance, in FIG. 8, each of (a) 800 and (b) 820 represent one timing step, (c) 830, (d) 840, (e) 850 and (f) 860 represent the other timing steps. In the half timing step from check nodes to variable nodes, there is a rule that defines which check nodes may perform a transfer operation.

In FIG. 8, the bold lines represent binary information transfer starting from input variable to check nodes. The narrow lines convert to bold lines once the transfer operation is completed. Only in the check nodes (boxes) which has or have one connection (narrow, edge) to variable nodes may transfer the calculated values (all XOR additions of bit values from the other variable nodes) to the variable node via that connection.

Figure 9:
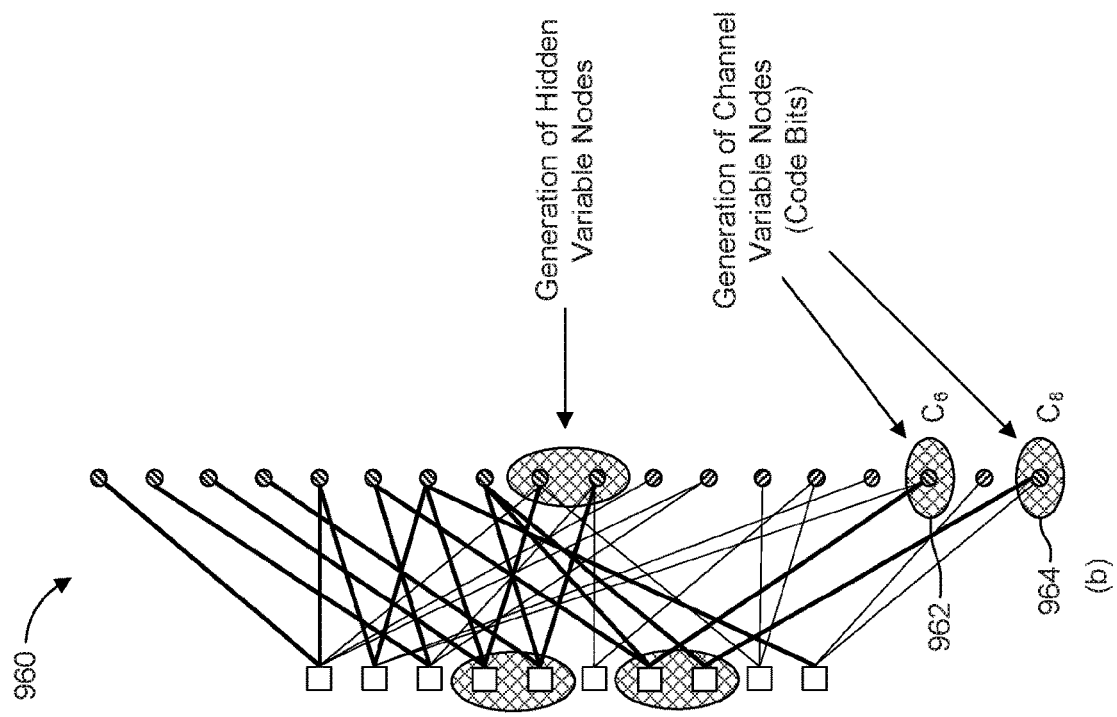
FIG. 9(a) is an illustration of a first timing step of a decision of code bit values.
FIG. 9(b) is an illustration of a second timing step of a decision of code bit values.
Figure 9:
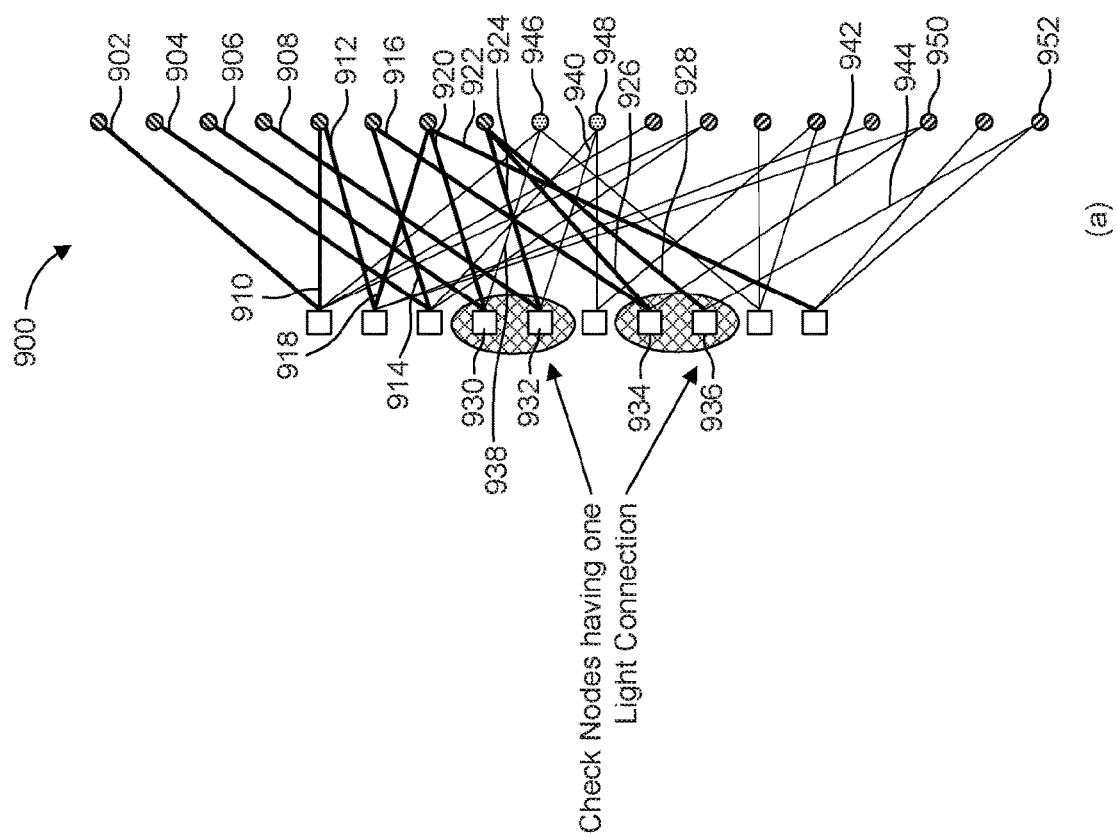

FIGS. 9(a)-(b) show details 900, 960 corresponding to (a) 800 and (b) 820 from the leftmost side, i.e. the first timing step, of FIG. 8. The initial information transfer from input nodes to check nodes are shown in bold lines 902-928. After the first bold connections 902-928, check nodes 4 930, 5 932, 7 934 and 8 936 have only one light connection 938-944 to variable nodes 946-952. The addition of binary values from other bold variable nodes are transferred to a variable node as shown in the next graph (b) 960. $c_6$, $c_8$ 962, 964 are generated in the first timing step corresponding to ((a) 800 and (b) 820).

In the second timing step ((c) 830 and (d) 840) of FIG. 8, $c_5$ 846, $c_7$ 848, $c_2$ 842 $c_4$ 844 are generated and in the third timing step ((e) 850 and (f) 860), $c_1$ 862, $c_3$ 864 are generated. In one option, indexing for code bits may be bit reversed.

FIG. 10 is a flowchart 1000 which depicts this procedure. In FIG. 10, frozen and unfrozen nodes are initialized 1004 after the flexible factor graph is obtained 1002. The frozen nodes are initialized by a fixed value, for example, zero, and the unfrozen nodes are initialized by the information bits to be intended for transmission. There may be n timing steps of a loop through encoding levels, beginning at an initial encoding level 1006. ($N=2^n$). Each timing step consists of variable nodes to check nodes transfer 1008 and check nodes to variable nodes transfer 1012. In check nodes to variable nodes transfer 1008, check nodes having only one connection after excluding previous transferred connections from variable nodes are found (selected) 1010. The summation by XOR of all previous transferred binary values is transferred to a variable node, the only one variable node which did not transfer. Including variable nodes having values by check nodes to variables transfer, the variable nodes to check nodes transfer 1008 is done in the remaining loop. Each iteration through the loop, so long as t≠n, t is incremented by one 1018. After n timing steps 1014, the loop is finished 1016 and the variable nodes corresponding to code bits have their values as output of encoding.

The proposed modified polar encoder shown in FIG. 8 outputs the same encoded bits as in conventional polar encoding, however the order of the generated bits is different. Using this proposed method, an early decoding procedure may be performed in accordance with the order of code bit generation by the modified polar encoder.

The modified encoding method for polar codes results in a different order of code bit generation than the conventional polar code encoding operation, for example, corresponding to FIG. 2, however both encoding procedures generate the same encoded bits. Based on the method described the above description, the order of code bit generation, $T_1, T_2, \ldots, T_n$, may be derived as below:

For N'=4, $T_1$: 3, 4; $T_2$: 1, 2.

For N'=8, $T_1$: 6, 8; $T_2$: 5, 7, 2, 4; $T_3$: 1, 3.

For N'=16, $T_1$: 12, 16; $T_2$: 11, 15, 10, 14, 4, 8; $T_3$: 9, 13, 3, 7, 2, 6; $T_4$: 1, 5.

For N'=32, 24, 32; $T_2$: 23, 31, 22, 30, 20, 28, 8, 16; $T_3$: 21, 29, 19, 27, 7, 15, 18, 26, 6, 14, 4, 12; $T_4$: 17, 25, 5, 13, 3, 11, 2, 10; $T_5$: 1, 9.

For N'=64, $T_1$: 48, 64; $T_2$: 47, 63, 46, 62, 44, 60, 40, 56, 16, 32; $T_3$: 45, 61, 43, 59, 39, 55, 15, 31, 42, 58, 38, 54, 14, 30, 36, 52, 12, 28, 8, 24; $T_4$: 41, 57, 37, 53, 13, 29, 35, 51, 11, 27, 7, 23, 34, 50, 10, 26, 6, 22, 4, 20; $T_5$: 33, 49, 9, 25, 5, 21, 3, 19, 2, 18; $T_6$: 1, 17.

For N'=128, $T_1$: 96, 128; $T_2$: 95, 127, 94, 126, 92, 124, 88, 120, 80, 112, 32, 64; $T_3$: 93, 125, 91, 123, 87, 119, 79, 111, 31, 63, 90, 122, 86, 118, 78, 110, 30, 62, 84, 116, 76, 108, 28, 60, 72, 104, 24, 56, 16, 48; $T_4$: 89, 121, 85, 117, 77, 109, 29, 61, 83, 115, 75, 107, 27, 59, 71, 103, 23, 55, 15, 47, 82, 114, 74, 106, 26, 58, 70, 102, 22, 54, 14, 46, 68, 100, 20, 52, 12, 44, 8, 40; $T_5$: 81, 113, 73, 105, 25, 57, 69, 101, 21, 53, 13, 45, 67, 99, 19, 51, 11, 43, 7, 39, 66, 98, 18, 50, 10, 42, 6, 38, 4, 36; $T_6$: 65, 97, 17, 49, 9, 41, 5, 37, 3, 35, 2, 34; $T_7$: 1, 33.

Where $N'(=2^{n'})$ is the length of a polar code which is considered for the generation order of code bits and $T_i$ is the set of code bit indices generated at encoding step i. (i=1, . . . , n').

Polar decoding may be performed based on an LDPC-like decoding procedure. An MSA or STA algorithm based on Equation 7 and 8 may be used without modification. In the decoder, the flexibility, for example, number of information bits (K), code length (N), or the like may be achieved by frozen bit handling and removing the columns in the flexible parity check matrix that correspond to frozen bits. Here, frozen bit handling refers to the initialization of frozen bits as infinite values.

Pruning operations of the parity check matrix, uniquely for each required code rate or number of unfrozen input bits, may be performed before polar decoding. On the other hand, in a flexible encoding/decoding method, a pruning procedure for each instance of code rate and code size is not necessary. Instead, just one off-line construction of the proposed flexible parity check matrix is sufficient to modify and configure this parity check matrix for various code rates and sizes both in the encoding and decoding operations.

Decoder extension may be performed by polar decomposition. Decomposition of the flexible factor graph into smaller factor graphs could result in less memory requirements by saving the smaller factor graph(s) only, as well as the benefit of regularized implementation thanks to the small factor graphs.

Figure 11:
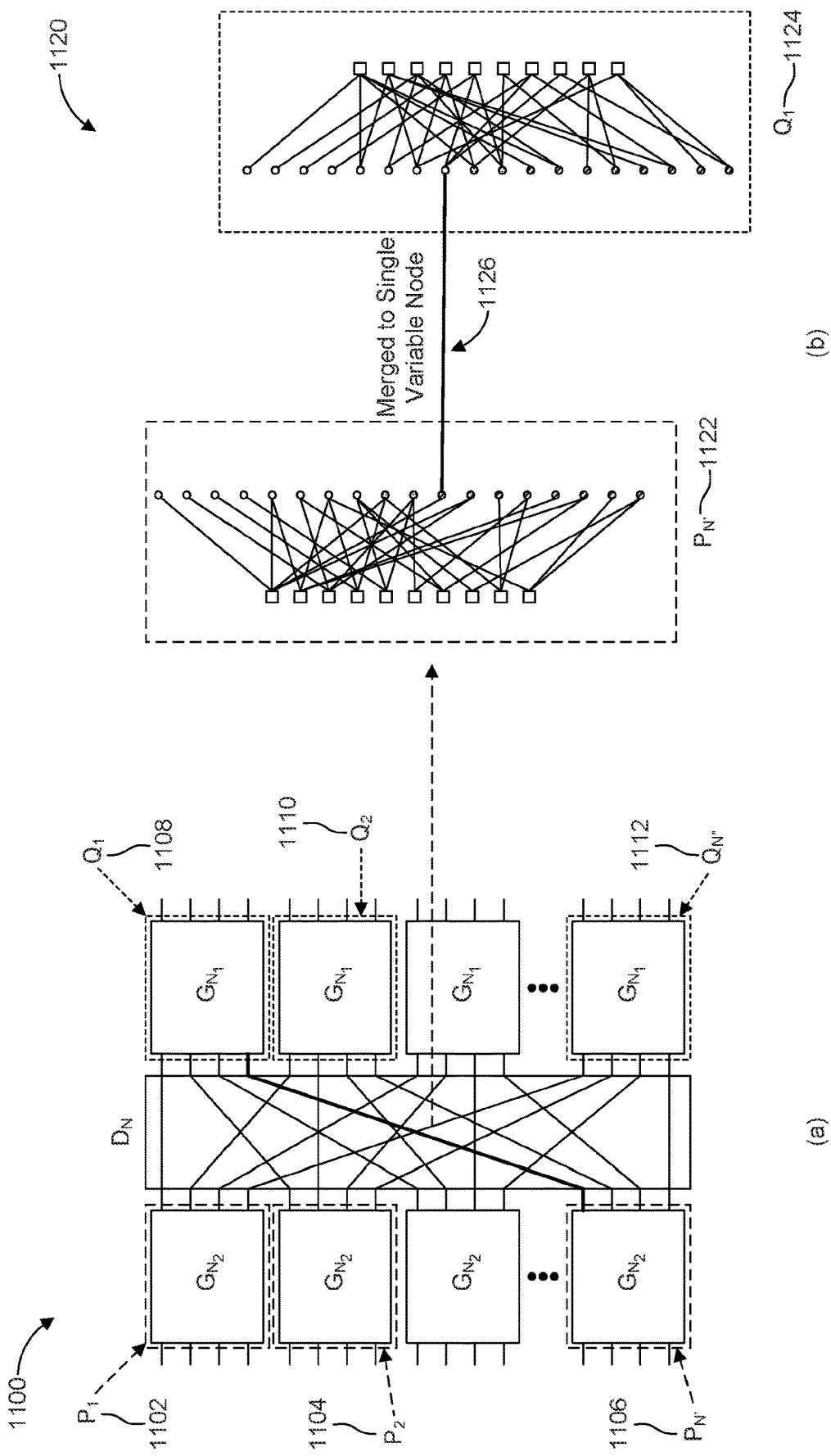
FIG. 11(a) is an illustration of an application of factor graphs in polar decomposition.
FIG. 11(b) is an illustration of an application of factor graphs in polar decomposition.

FIG. 11(a) shows a polar code with a length of N=N'×N" which may be decomposed into component polar codes $P_1, \ldots, P_{N'}$ and $Q_1, \ldots, Q_{N''}$, where $P_i$, i=1, N' and $Q_i$, i=1, N" correspond to component codes in various levels of the polar encoder. The decomposition method may be based on that of E. Arikan, "Channel polarization: A method for constructing capacity-achieving codes for symmetric binary-input memoryless channels," IEEE Transactions on Information Theory, July 2009, incorporated herein by reference. In an option, decoding of the component polar codes according to the LDPC-like BP decoding methods.

In an embodiment, the component polar decoders may be replaced with component polar decoders with a flexible parity check matrix. It is possible to depict the connections between component polar codes and merge the corresponding variable nodes in these component codes into single variable nodes. For instance, the connection between the last output bit (channel variable node) in $P_{N'}$ 1122 and the first input bit (input variable node) in $Q_1$ 1124, as shown in FIG. 11(b) as a bold line 1126, may be used to merge these variable nodes into a single node. The other connections between $P_1, \ldots, P_{N'}$ 1102-1106 and $Q_1, \ldots, Q_{N''}$ may follow the same rule.

In the proposed decoding method with polar code decomposition, the iteration steps that correspond to variable nodes to check nodes and check nodes to variable nodes may be performed based on LDPC-like BP decoding message passing rules of equation 7 and 8. Even though the component polar decoding may be considered as replaced by LDPC-like BP decoding for the corresponding component polar codes, the overall decoding iterations are performed in between all the check nodes and all variable nodes in the factor graph, hence without the necessity of differentiating specific component factor graphs in the decoding procedure. Thus, there is no sequential order in LDPC-like BP decoding of component polar code. Moreover, the message passing rules given in equations 7 and 8 are applicable in the proposed decoding procedure. A modification in the message passing procedure due to the considered variable node merger operation, where $v_s$ denotes the shared variable nodes between $P_1, \ldots P_{N'}$ and $Q_1, \ldots Q_{N'''}$, $x_{v_s \to c}$, may be described as, $$x_{v_s \to c} = L_{v_s}^{init} + \sum_{c' \in \{C_{v_s}^P \cup C_{v_s}^Q / c\}} y_{c' \to v_s} \quad \text{Equation 10}$$

where P stands for the set of the factor graphs of component polar codes including $v_s$ among $P_1, \ldots, P_{N'}$ and Q stands for the set of the factor graphs of component polar codes including $v_s$ among $Q_1, \ldots, Q_{N'''}$. $C_{v_s}^P$ is the set of check nodes connected to $v_s$ within P and $C_{v_s}^Q$ is the set of check nodes connected to $v_s$ within Q.

Simulation conditions are summarized in Table 2.

Figure 12:
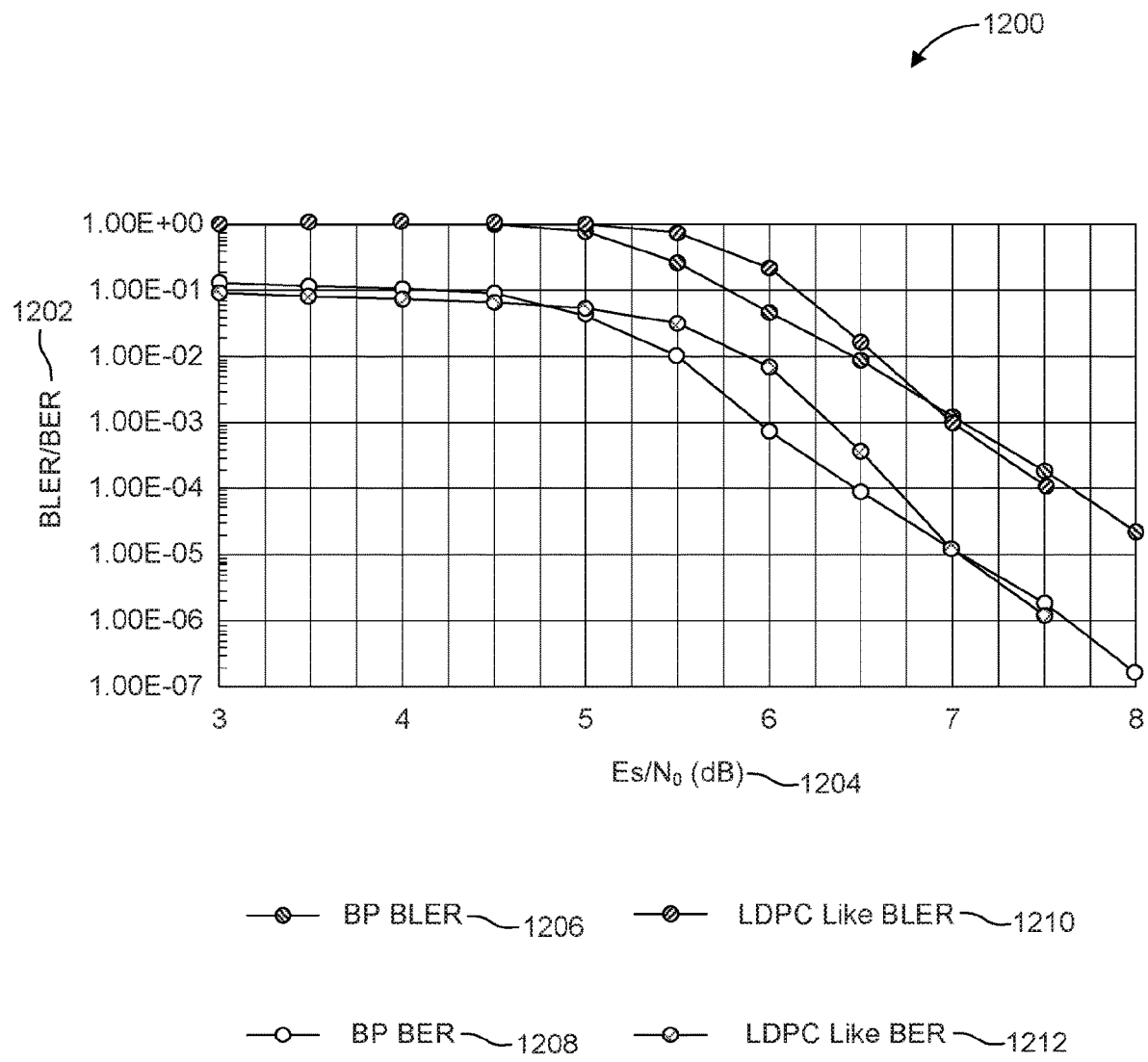
FIG. 12 is an illustration of a comparison of block/bit error performance between BP and LDPC like BP.

FIG. 12 shows BLER/BER 1202 compared to $E_s/N_0$ db 1204. There is a difference of error performance between BP decoding 1206, 1208 and LDPC like BP decoding 1210, 1212 by extension method at low $E_s/N_0$, but no difference is observed at high $E_s/N_0$.

Figure 13:
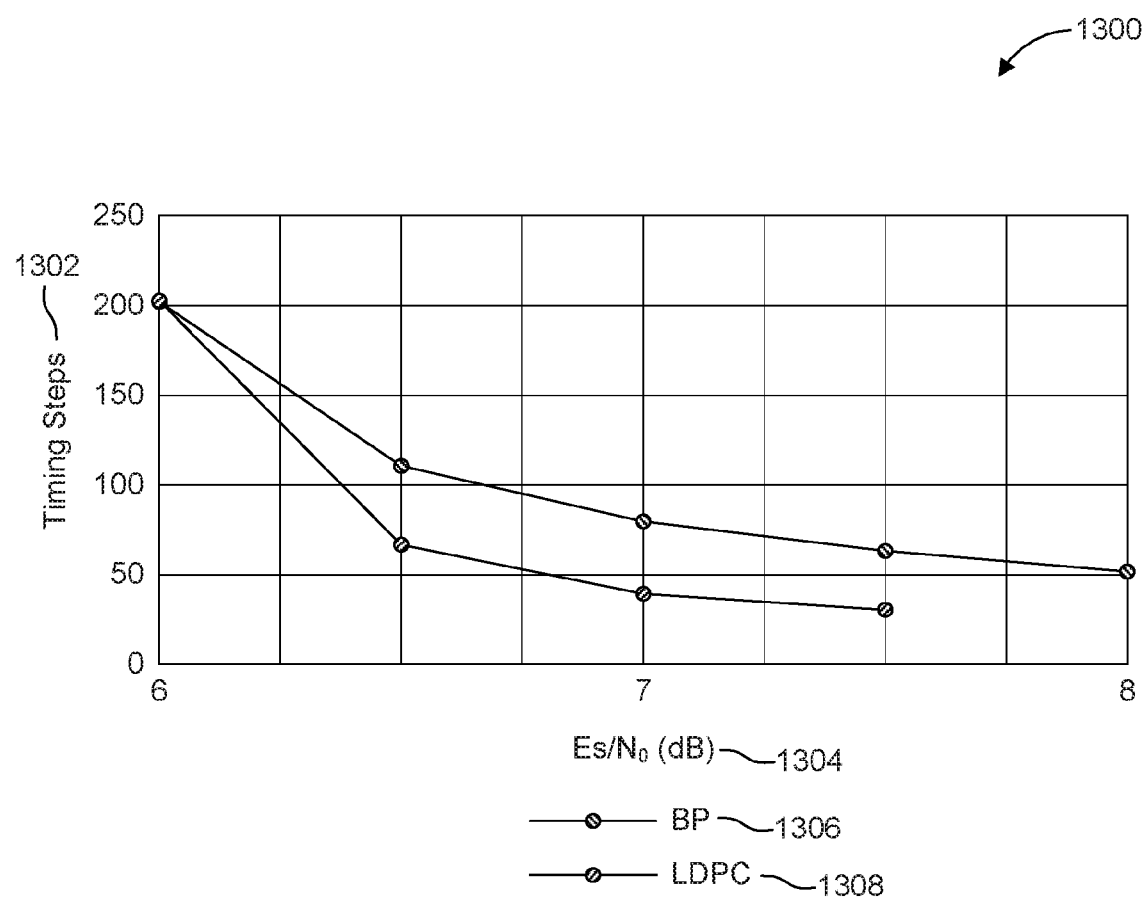
FIG. 13 is an illustration of a comparison of timing steps between BP and LDPC like BP.

FIG. 13 shows timing steps 1302 compared to $E_s/N_0$ db 1304. From FIG. 13, the benefit of latency reduction by LDPC like BP decoding 1308 is observed by extension method compared to BP 1306.

TABLE 2

| Simulation Conditions | |
|---|---|
| Parameters | Values |
| N | 1024 |
| K | 854 |
| Code rate | 854/1024 |
| CRC | No CRC |
| Decoding scheme | Flooding BP or LDPC like BP |
| Code construction | 3GPP NR polar code sequence |
| Modulation | QPSK |
| Maximum iteration | Flooding BP = 60, LDPC like BP = 300 |
| Flooding BP | Scaled minsum round robin (0.9375) |
| Extension method | Extension by component polar N' = 32 |
| Minimum counted error | 100 block errors |

Although the features and elements of the present invention are described in the preferred embodiments in particular combinations, each feature or element may be used alone without the other features and elements of the preferred embodiments or in various combinations with or without other features and elements of the present invention.

Although the embodiments described herein consider New Radio (NR), 5G or LTE, LTE-A specific, tera bit or tera Hz communication protocols, it is understood that the solutions described herein are not restricted to this scenario and are applicable to other wireless systems as well.

Although features and elements are described above in particular combinations, one of ordinary skill in the art will appreciate that each feature or element may be used alone or in any combination with the other features and elements. In addition, the methods described herein may be implemented in a computer program, software, or firmware incorporated in a computer-readable medium for execution by a computer or processor. Examples of computer-readable media include electronic signals (transmitted over wired or wireless connections) and computer-readable storage media. Examples of computer-readable storage media include, but are not limited to, a read only memory (ROM), a random access memory (RAM), a register, cache memory, semiconductor memory devices, magnetic media such as internal hard disks and removable disks, magneto-optical media, and optical media such as CD-ROM disks, and digital versatile disks (DVDs). A processor in association with software may be used to implement a radio frequency transceiver for use in a WTRU, UE, terminal, base station, RNC, or any host computer.

What is claimed is:

1. A method performed by a wireless transmit/receive unit (WTRU), the method comprising:
   indexing a block of input bits in a first timing step;
   generating code bits, from the block of input bits, wherein the code bits have a second timing step which is different than the first timing step; and
   transmitting the code bits.

2. The method of claim 1, wherein the code bits are generated via a pruned factor graph.

3. The method of claim 2, wherein the pruned factor graph is pruned based on a code rate.

4. The method of claim 2, wherein the pruned factor graph is pruned based on a number of input bits.

5. The method of claim 1, wherein the WTRU is a user equipment (UE).

6. The method of claim 1, wherein the WTRU is a base station.

7. A wireless transmit/receive unit (WTRU) comprising:
   circuitry configured to index a block of input bits in a first timing step;
   circuitry configured to generate code bits, from the block of input bits, wherein the code bits have a second timing step which is different than the first timing step; and
   a transmitter configured to transmit the code bits.

8. The WTRU of claim 7, wherein the code bits are generated via a pruned factor graph.

9. The WTRU of claim 8, wherein the pruned factor graph is pruned based on a code rate.

10. The WTRU of claim 8, wherein the pruned factor graph is pruned based on a code length.

11. The WTRU of claim 8, wherein the pruned factor graph is pruned based on a number of input bits.

12. The WTRU of claim 7, wherein the WTRU is a user equipment (UE).

13. The WTRU of claim 7, wherein the WTRU is a base station.

14. A wireless transmit/receive unit (WTRU) comprising:
   a receiver configured to receive code bits;
   circuitry configured to determine input bits, from the received code bits, wherein the input bits have a first timing step and the received code bits have a second timing step which is different than the first timing step.

15. The WTRU of claim 14, wherein the input bits are determined via a pruned factor graph.

16. The WTRU of claim 15, wherein the pruned factor graph is pruned based on a code rate.

17. The WTRU of claim 15, wherein the pruned factor graph is pruned based on a number of input bits.

18. The WTRU of claim 15, wherein the pruned factor graph is pruned based on a code length.

19. The WTRU of claim 14, wherein the WTRU is a user equipment (UE).

20. The WTRU of claim 14, wherein the WTRU is a base station.

* * * * *